(12) United States Patent
Prest et al.

(10) Patent No.: US 10,542,628 B2
(45) Date of Patent: Jan. 21, 2020

(54) ENCLOSURE FOR AN ELECTRONIC DEVICE HAVING A SHELL AND INTERNAL CHASSIS

(71) Applicant: Apple Inc., Cupertino, CA (US)

(72) Inventors: Christopher D. Prest, San Francisco, CA (US); Colin M. Ely, Sunnyvale, CA (US); Naoto Matsuyuki, Kasugai (JP); Joseph C. Poole, Hayward, CA (US)

(73) Assignee: APPLE INC., Cupertino, CA (US)

( * ) Notice: Subject to any disclaimer, the term of this patent is extended or adjusted under 35 U.S.C. 154(b) by 10 days.

(21) Appl. No.: 15/821,789

(22) Filed: Nov. 23, 2017

(65) Prior Publication Data

US 2019/0045642 A1 Feb. 7, 2019

Related U.S. Application Data

(60) Provisional application No. 62/540,345, filed on Aug. 2, 2017.

(51) Int. Cl.
| | |
|---|---|
| *H05K 5/00* | (2006.01) |
| *G06F 1/16* | (2006.01) |
| *H05K 7/14* | (2006.01) |
| *H05K 5/03* | (2006.01) |
| *H05K 5/02* | (2006.01) |
| *G04G 17/08* | (2006.01) |

(52) U.S. Cl.
CPC .......... *H05K 5/0095* (2013.01); *G04G 17/08* (2013.01); *G06F 1/163* (2013.01); *G06F 1/1626* (2013.01); *G06F 1/1633* (2013.01); *G06F 1/1637* (2013.01); *G06F 1/1656* (2013.01); *H05K 5/006* (2013.01); *H05K 5/0013* (2013.01); *H05K 5/0017* (2013.01); *H05K 5/0217* (2013.01); *H05K 5/0247* (2013.01); *H05K 5/03* (2013.01); *H05K 7/1417* (2013.01)

(58) Field of Classification Search
None
See application file for complete search history.

(56) References Cited

U.S. PATENT DOCUMENTS

| | | | |
|---|---|---|---|
| 1,675,910 | A | 7/1928 | Riker |
| 2,210,094 | A | 8/1940 | Mueller |

(Continued)

FOREIGN PATENT DOCUMENTS

| | | |
|---|---|---|
| CN | 201022205 | 2/2008 |
| CN | 201248054 | 5/2009 |

(Continued)

OTHER PUBLICATIONS

Author Unknown, "Laboratory Instruments," http://www.mocon.com, 2 pages, at least as early as Oct. 12, 2012.

(Continued)

*Primary Examiner* — Xanthia C Cunningham
(74) *Attorney, Agent, or Firm* — Dorsey & Whitney LLP

(57) ABSTRACT

A housing or enclosure for an electronic device is formed from a shell and chassis may positioned along an interior of the shell. The shell may be formed from a hard or cosmetic material and the chassis may be formed from a machinable material. The chassis may define one or more machined surfaces that are configured to receive or mount a component of the electronic device.

13 Claims, 21 Drawing Sheets

(56) References Cited

U.S. PATENT DOCUMENTS

| | | |
|---|---|---|
| 2,420,989 A | 5/1947 | Waldron |
| 2,728,929 A | 1/1956 | Bell |
| 2,859,510 A | 11/1958 | Baxa |
| 2,909,281 A | 10/1959 | Koskinen |
| 3,012,384 A | 12/1961 | Brown et al. |
| 3,123,910 A | 3/1964 | Neilson |
| 3,290,832 A | 12/1966 | Highberg et al. |
| 3,346,904 A | 10/1967 | Armstrong |
| 3,696,563 A | 10/1972 | Rands |
| 4,038,783 A | 8/1977 | Rosenthal |
| 4,111,029 A | 9/1978 | Dulaquais |
| 4,164,704 A | 8/1979 | Kato et al. |
| 4,232,928 A | 11/1980 | Wickersham |
| 4,445,300 A | 5/1984 | Sekiya et al. |
| 3,202,561 A | 8/1985 | Swanson et al. |
| 4,552,800 A | 11/1985 | Blasch et al. |
| 4,584,799 A | 4/1986 | Juvet |
| 4,594,814 A | 6/1986 | Olszewski et al. |
| 4,753,918 A | 6/1988 | Cyron |
| 4,911,796 A | 3/1990 | Reed |
| 4,945,687 A | 8/1990 | Scheider et al. |
| 5,021,213 A | 6/1991 | Nishio et al. |
| 5,028,075 A | 7/1991 | Donnelly |
| 5,083,401 A | 1/1992 | Yamashita et al. |
| 5,144,536 A | 9/1992 | Tsukada et al. |
| 5,217,335 A | 6/1993 | Houchens, Jr. et al. |
| 5,276,999 A | 1/1994 | Bando |
| 5,280,819 A | 1/1994 | Newkirk et al. |
| 5,329,735 A | 7/1994 | Charlton et al. |
| 5,353,463 A | 10/1994 | Bracy, Jr. |
| 5,590,387 A | 12/1996 | Schmidt et al. |
| 5,720,649 A | 2/1998 | Gerber et al. |
| 5,779,218 A | 7/1998 | Kowanz |
| 5,843,117 A | 12/1998 | Alt et al. |
| 5,953,989 A | 9/1999 | Uchiyama et al. |
| 6,087,191 A | 7/2000 | Boggs |
| 6,110,015 A | 8/2000 | Christianson et al. |
| 6,149,506 A | 11/2000 | Duescher |
| 6,183,347 B1 | 2/2001 | Shaw |
| 6,276,994 B1 | 8/2001 | Yoshida et al. |
| 6,406,769 B1 | 6/2002 | Delabre |
| 6,413,895 B1 | 7/2002 | Merkel et al. |
| 6,453,783 B2 | 9/2002 | Yu et al. |
| 6,464,080 B1 | 10/2002 | Morris et al. |
| 6,517,995 B1 | 2/2003 | Jacobson et al. |
| 6,717,738 B2 | 4/2004 | Yamada et al. |
| 6,811,136 B2 | 11/2004 | Eberhardt et al. |
| 7,122,057 B2 | 10/2006 | Beam et al. |
| 7,171,838 B2 | 2/2007 | Shiokawa |
| 7,540,697 B2 | 6/2009 | Wang et al. |
| 7,582,175 B2 | 9/2009 | Trejo-Rincon |
| 7,597,483 B2 | 10/2009 | Simmons et al. |
| 7,685,676 B2 | 3/2010 | McClellan |
| 7,724,532 B2 | 5/2010 | Zadesky et al. |
| 7,774,918 B2 | 8/2010 | Ainsworth |
| 8,015,852 B2 | 9/2011 | Su |
| 8,052,743 B2 | 11/2011 | Weber et al. |
| 8,066,251 B2 | 11/2011 | Brown |
| 8,157,936 B2 | 4/2012 | Tsuzuki et al. |
| 8,252,379 B2 | 8/2012 | Nagashima |
| 8,295,902 B2 | 10/2012 | Salahieh et al. |
| 8,439,947 B2 | 5/2013 | Howard et al. |
| 8,454,705 B2 | 6/2013 | Pressacco et al. |
| 8,460,060 B2 | 6/2013 | Wilson et al. |
| 8,530,847 B2 | 9/2013 | Frank et al. |
| 8,564,961 B2 | 10/2013 | Weber |
| 8,568,551 B2 | 10/2013 | Brennan et al. |
| 8,597,078 B2 | 12/2013 | Wilson et al. |
| 8,601,849 B2 | 12/2013 | Luo et al. |
| 8,703,040 B2 | 4/2014 | Liufi et al. |
| 8,733,422 B2 | 5/2014 | Browning et al. |
| 8,738,104 B2 | 5/2014 | Yeates |
| 8,994,608 B2 | 3/2015 | Russell-Clarke et al. |
| 9,132,510 B2 | 9/2015 | Russell-Clarke et al. |
| 9,221,289 B2 | 12/2015 | Prest et al. |
| 9,284,228 B2 | 3/2016 | Nahas et al. |
| 9,451,065 B2 | 9/2016 | Van Asseldonk et al. |
| 9,634,378 B2 | 4/2017 | Golko et al. |
| 9,750,322 B2 | 9/2017 | Nazzaro et al. |
| 2005/0064345 A1 | 3/2005 | Oyake |
| 2006/0008616 A1 | 1/2006 | Dean et al. |
| 2006/0097127 A1 | 5/2006 | Firth |
| 2006/0162849 A1 | 7/2006 | Han |
| 2007/0019395 A1 | 1/2007 | Yeh et al. |
| 2007/0039691 A1 | 2/2007 | Mroz |
| 2008/0206509 A1 | 8/2008 | Kent et al. |
| 2008/0257006 A1 | 10/2008 | Durney et al. |
| 2008/0312727 A1 | 12/2008 | Blank |
| 2009/0014118 A1 | 1/2009 | Ratcliffe |
| 2009/0043228 A1 | 2/2009 | Northrop et al. |
| 2010/0285248 A1 | 11/2010 | Zhu et al. |
| 2011/0041553 A1 | 2/2011 | Xiong et al. |
| 2011/0156361 A1 | 6/2011 | Ghalambor et al. |
| 2011/0267773 A1 | 11/2011 | MacFarlane |
| 2012/0212890 A1 | 8/2012 | Hoshino et al. |
| 2013/0216740 A1 | 8/2013 | Russell-Clarke et al. |
| 2013/0251934 A1 | 9/2013 | Caracciolo et al. |
| 2013/0318766 A1 | 12/2013 | Kiple et al. |
| 2014/0076731 A1 | 3/2014 | Russell-Clarke et al. |
| 2014/0082926 A1 | 3/2014 | Tam et al. |
| 2014/0102162 A1 | 4/2014 | Morgenstern et al. |
| 2014/0106129 A1 | 4/2014 | Teshima et al. |
| 2015/0273524 A1 | 10/2015 | Ely et al. |
| 2015/0342308 A1* | 12/2015 | Wilson .............. A45F 5/00 224/219 |
| 2015/0374397 A1 | 12/2015 | Brannon |
| 2016/0089811 A1 | 3/2016 | Matsuyuki et al. |
| 2016/0090326 A1 | 3/2016 | Matsuyuki et al. |
| 2016/0256979 A1 | 9/2016 | Matsuyuki et al. |
| 2017/0060193 A1 | 3/2017 | Franklin et al. |
| 2017/0304032 A1 | 10/2017 | Jung et al. |

FOREIGN PATENT DOCUMENTS

| | | |
|---|---|---|
| CN | 101693629 | 4/2010 |
| CN | 101877951 | 11/2010 |
| CN | 201940834 | 8/2011 |
| CN | 102316179 | 1/2012 |
| CN | 102695966 | 9/2012 |
| CN | 202720538 | 2/2013 |
| CN | 202872871 | 4/2013 |
| CN | 203191877 | 9/2013 |
| CN | 203492064 | 3/2014 |
| CN | 103864452 | 6/2014 |
| CN | 103873619 | 6/2014 |
| CN | 103951420 | 7/2014 |
| JP | 60244493 | 12/1985 |
| JP | 200061745 | 2/2000 |
| KR | 1020080103031 | 11/2008 |
| WO | WO03/002289 | 1/2003 |
| WO | WO2012/007755 | 1/2012 |
| WO | WO2013/093822 | 6/2013 |

OTHER PUBLICATIONS

Author Unknown, "Stewmac Inlay Tools and Materials," http://web.archirve.org/...op/Inlay,_pearl/Tools_and_supplies_for:_Inlay,_pearl_cutting/Carbide_Downcut_Inlay_Router_Bits.html, 5 pages, at least as Early as Dec. 4, 2013.

* cited by examiner

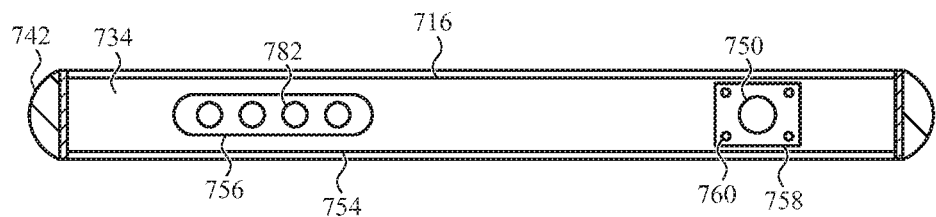
*FIG. 7C*
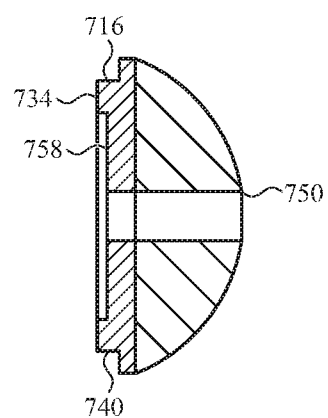 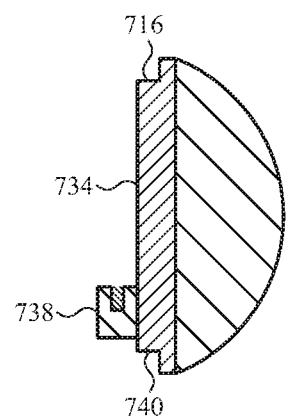
*FIG. 7D*  *FIG. 7E*

ENCLOSURE FOR AN ELECTRONIC DEVICE HAVING A SHELL AND INTERNAL CHASSIS

CROSS-REFERENCE TO RELATED APPLICATION(S)

This application claims the benefit under 35 U.S.C. § 119(e) of U.S. Provisional Patent Application No. 62/540,345, filed on Aug. 2, 2017, and entitled "Enclosure for an Electronic Device Having a Shell and Internal Chassis," which is incorporated by reference as if fully disclosed herein.

FIELD

The described embodiments relate generally to electronic devices. More particularly, the present embodiments relate to enclosures having a shell and a machinable layer or chassis formed within the shell.

BACKGROUND

Many modern electronic devices are complex in design, having a great number of features within a small package. Mobile and wearable electronic devices in particular may require multiple components to be precisely designed and constructed to meet customer needs including high portability.

Components for mobile and wearable devices may be made from various materials. Some materials may have desirable attributes for device performance and/or appearance, but may at the same time be difficult and/or costly to produce with the precision necessary for inclusion within highly portable devices.

SUMMARY

Embodiments described herein relate to precisely machined components for electronic devices made from brittle materials. Brittle components of an electronic device may be formed from ceramic or other materials which are difficult to machine due to hardness, brittleness, and/or other properties. To reduce the cost and increase effectiveness of machining brittle components, a machinable material may be deposited onto the brittle component. The machinable material may then be machined or otherwise processed to produce a finished surface.

In one aspect, an electronic device may include a shell forming an exterior surface of the electronic device, a chassis formed along an interior of the shell, a display positioned at least partially within the shell, and a transparent cover positioned over the display. The chassis defines a machined shelf and the transparent cover is coupled to the machined shelf. A seal is formed between the transparent cover and the machined shelf.

The chassis may be formed from a chassis material with a greater machinability than the shell. In some examples, the shell includes a back surface opposite the transparent cover. The back surface defines an opening, and the chassis defines an attachment feature within the opening. A back cover is coupled to the attachment feature of the chassis, and an additional seal is formed between the attachment feature and the back cover.

In some examples, the transparent cover is press fit within the machined shelf. The chassis may include a set of threaded mounts, and a circuit board may be attached to the set of threaded mounts. In some examples, the shell defines a first portion of an opening configured to receive a component. The chassis defines a second portion of the opening configured to receive the component. The component may be a compressible button and the second portion of the opening may define a surface configured to receive the compressible button.

In further examples, an O-ring is positioned between the second portion of the opening and the compressible button. The O-ring forms a button seal between the chassis and the compressible button. The shell may include a ceramic material, a hardened steel, stainless steel, or other difficult to machine material, and the chassis may include at least one of aluminum, machine steel, brass or plastic that is more machinable than the shell.

In another aspect, a housing for an electronic device includes a shell. A machinable layer is deposited over an interior surface of the shell, and the machinable layer includes at least one of a metal or a plastic. The machinable layer defines a mounting surface configured to mount a component of the electronic device.

In some examples, the shell defines an opening, and a portion of the machinable layer is positioned at least partially within the opening. The portion of the machinable layer defines a machined surface within the opening. The machined surface may form a bearing surface configured to receive a rotatable shaft within the opening. In other examples, the shell defines a first portion of a recess into a side of the housing. The machinable layer defines a second portion of the recess, and the recess is configured to receive a watch crown.

In still other examples, the mounting surface defines a threaded aperture. The component may be attached to the housing by a fastener secured to the threaded aperture. The machinable layer may include an aluminum material cast into an interior portion of the shell.

In another aspect, an electronic device includes a ceramic shell forming an external surface of the electronic device. The shell defines a display opening and a first portion of a component opening formed along the external surface. A display is positioned within the display opening. A machined chassis is coupled to an interior surface of the shell and defines a second portion of the component opening. A component is positioned within the component opening.

In some examples, the second portion of the opening defines a contoured surface. The component opening may extend along a length of the shell, and the second portion of the component opening may have a maximum width which is greater than an opening width of the first portion along the external surface. In some examples, the machined chassis defines a shelf along a perimeter of the display opening. The electronic device includes a transparent cover positioned over the display, and the shelf and the transparent cover cooperate to form a seal configured to prevent ingress of contaminants into the electronic device.

BRIEF DESCRIPTION OF THE DRAWINGS

The disclosure will be readily understood by the following detailed description in conjunction with the accompanying drawings, wherein like reference numerals designate like elements.

FIG. 7C depicts a cross-sectional view of the housing depicted in FIG. 7B, taken along line P-P.

FIG. 7D depicts a cross-sectional view of the housing depicted in FIG. 7B, taken along line Q-Q.

FIG. 7E depicts a cross-sectional view of the housing depicted in FIG. 7B, taken along line R-R.

Figure 1:
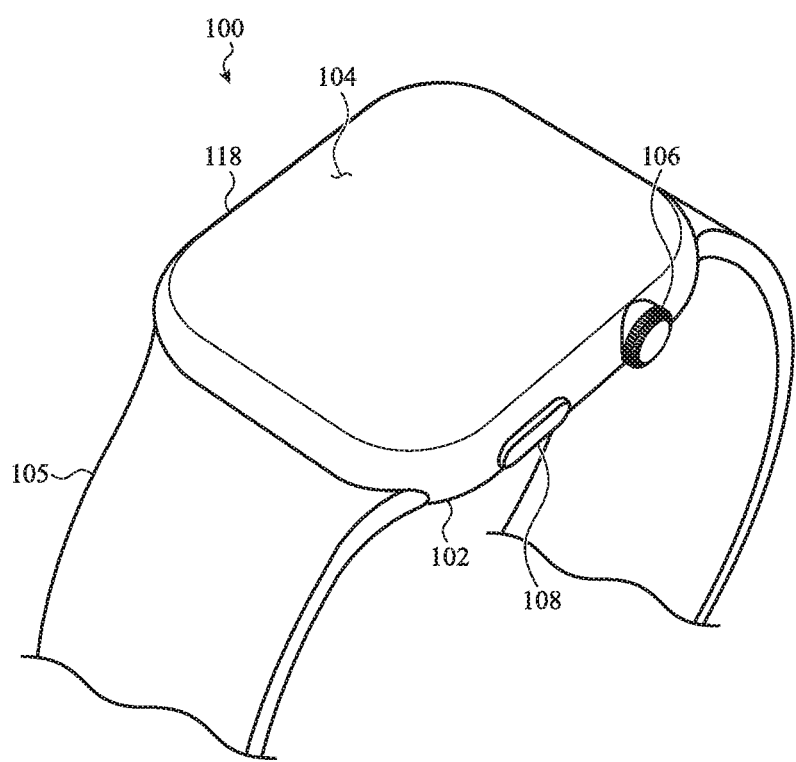
FIG. 1 depicts an example electronic device in the form of a watch incorporating one or more brittle components, such as a shell for a housing, according to the present disclosure.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to portable electronic devices having precisely machined components, such as a shell for a housing of the device, formed from a brittle or otherwise difficult to machine material. Such brittle or difficult to machine components may be costly to manufacture with a high degree of precision, requiring additional machining time and causing additional wear to machining tools. This disclosure is directed to methods, systems, and devices in which such costs and difficulties of manufacturing may be reduced.

A variety of brittle and difficult to process materials may be used to form components of electronic devices. Such materials may contain properties which are desirable for use within an electronic device. For example, a brittle material, such as a ceramic material, may form an outer shell or enclosure of an electronic device. A brittle material like a ceramic may be particularly suitable due to the material's hardness, appearance, durability, impact resistance, transmissivity of electromagnetic radiation, and so on. Similarly, an outer shell may be formed from a hardened steel, stainless steel, or other material that is difficult to machine or process but provides a desirable appearance, durability, and/or surface hardness for the electronic device.

While such brittle or otherwise difficult to process materials may have desirable properties, the material may also be costly to manufacture into a finished component. This drawback may be particularly disadvantageous when producing highly portable devices, such as wearable electronics, in which the size of the device requires components to be manufactured with a high level of precision to maintain portability, form water tight seals, have small gaps between parts, and provide other fine features that enhance a user experience.

The present disclosure advantageously reduces the cost of producing components made from brittle materials for use within portable electronic devices. In a first example, a shell for a housing may be formed from a ceramic material. Example ceramic materials may include zirconia, zirconium dioxide, partially stabilized zirconia, alumina, aluminum oxides, glass, and other similar materials. In some instances, a ceramic shell is formed by placing a slurry or paste into a mold or similar shaping mechanism. The ceramic material is partially cured in order to yield a green body. This green body is then sintered, in which the green body is heated, removing any remaining moisture and hardening the green body into a ceramic shell. After sintering, the ceramic shell may be machined to form an exterior surface of the electronic device.

A sintered ceramic component, such as a ceramic housing, may be difficult and costly to machine (e.g., the ceramic material may have a low machinability). For example, the chosen ceramic material may have a high hardness rating, such that only expensive equipment may be used for cutting, grinding, and other machining. The ceramic material may additionally increase wear on machining equipment, further increasing cost. Many ceramics are brittle and can only be shaped through techniques which subtract only small portions of the ceramic material at a time, further increasing the time and cost of machining components. Other suitable shell materials including high carbon steel, stainless steel, and other metal alloys may also be difficult or costly to machine.

In high-precision applications, such as housings for portable electronic devices, the ceramic manufacturing process may further add cost to producing a final, machined component. Edges of a component which mate with surrounding parts may require very close tolerances. However, the curing and sintering processes for manufacturing ceramics generally result in volumetric shrinking toward a final product. Thus, sintered ceramic components are traditionally produced with excess material which must to be removed in order to yield finished components within required tolerances.

With the present disclosure, a high-precision surface may be produced by depositing a machinable material onto a brittle or difficult to machine component, such as a ceramic shell for a housing. The machinable material may be deposited by an appropriate technique, such as casting, molding, plating, brazing, soldering, coating (e.g., plasma spray, thermal spray, cold spray), vapor deposition, chemical deposition, insert molding, overmolding, or 3-D printing. The machinable material may then be processed by grinding, cutting, turning, boring, drilling, tapping, and so on to produce a precise finished surface for fitting with other parts.

In one example, an external housing for an electronic device may be formed from a ceramic material. The shell may be shaped to hold device components, including an electronic display. A transparent cover may be placed over the electronic display, and one or more edges of the transparent cover may interface with the housing. The interface between the housing and the transparent cover requires a precise fit.

In order to achieve a precise fit for the transparent cover, the housing may include a shell forming an exterior surface of the electronic device. The shell may be molded, cured, and sintered to produce a cover attachment point, such as a shelf. However, the ceramic shelf may not be produced within the tolerances required for the finished electronic device. Thus, a machinable material, such as a softer or more machinable metal, plastic, or other similar material may be deposited on and/or around the shelf. Portions of the machinable material are then removed from the shelf to produce a precise, machined surface. The transparent cover may then be coupled to the machined surface, such as by press fitting or by bonding using an adhesive or bonding agent.

In another example, a ceramic housing for an electronic device may interface with a number of internal and/or external components. The components may be rigidly or otherwise mounted to the housing, requiring the housing to include multiple internal and/or external mounting surfaces. Traditionally, a ceramic housing may be directly machined to produce each of the required mounting surfaces, which may require a costly, multi-step machining process.

Instead, a machinable material, such as a machinable metal or plastic, may be deposited over an interior surface of a shell and machined to form a chassis for attachment of components. In some examples, a block of machinable material may be cast into (or otherwise attached to) an interior surface of the shell. Portions of the block of material may then be selectively removed to generate a machined chassis, defining holes, protrusions, threads, planes, and other mounting surfaces and features.

In other examples, a layer of machinable material may be deposited over all or a portion of the shell, and mounting features may be added to the deposited layer. Other portions of the layer of machinable material may be selectively removed to produce additional mounting features for parts of the electronic device. It should be understood that these methods may be combined in a variety of ways to produce the finished surfaces desired for attaching device components to the shell of the housing.

These and other embodiments are discussed below with reference to FIGS. 1-7G. However, those skilled in the art will readily appreciate that the detailed description given herein with respect to these figures is for explanatory purposes only and should not be construed as limiting.

FIG. 1 depicts an example electronic device in the form of a watch incorporating one or more brittle components, such as a shell for a housing, according to the present disclosure. The electronic device 100 includes a housing 102 surrounding a display 104. The display 104 can provide a visual output to the user. The display 104 can be implemented with any suitable technology, including, but not limited to: a liquid-crystal display (LCD) element, an organic light emitting diode (OLED) element, an electroluminescent (EL) display, and the like.

A transparent cover 118 may be positioned over the front surface (or a portion of the front surface) of the electronic device 100. A touch and/or force sensor may be positioned below the transparent cover 118, and enable least a portion of the transparent cover 118 to function as an input surface that receives touch and/or force inputs. The transparent cover 118 may be formed from a sheet of glass, plastic, sapphire, or combinations thereof. The transparent cover 118 may also be a laminate or composite of multiple materials. In one embodiment, the transparent cover 118 covers the display 104.

Various layers of a display stack (such as the transparent cover 118, display 104, touch sensor layer, and so on) may be adhered together with an optically transparent adhesive and/or may be supported by a common frame or portion of the housing 102. A common frame may extend around a perimeter, or a portion of the perimeter, of the layers, may be segmented around the perimeter, or a portion of the perimeter, or may be coupled to the various layers of the display stack in another manner.

In some embodiments, each of the layers of the display stack may be attached or deposited onto separate substrates that may be laminated or bonded to each other. The display stack may also include other layers for improving the structural or optical performance of the display 104, including, for example, polarizer sheets, color masks, and the like. Additionally, the display stack may include a touch sensor for determining the location of one or more touches on the transparent cover 118 of the electronic device 100.

In many cases, the electronic device 100 can also include a processor, memory, power supply and/or battery, network connections, sensors, input/output ports, acoustic components, haptic components, digital and/or analog circuits for performing and/or coordinating tasks of the electronic device 100, and so on. For simplicity of illustration, the electronic device 100 is depicted in FIG. 1 without many of these components, each of which may be included, partially and/or entirely, within the housing 102.

The electronic device may be operable to receive additional input from a user, such as through a button 108. The electronic device 100 may also be operable to perform various actions in response to input received via a watch crown 106 or similar input structure. The watch crown 106 may be operable to receive rotational and other inputs, such as force inputs to the watch crown 106.

As a wearable device, the electronic device 100 may be compact, lightweight, and durably constructed. Accordingly, components of the electronic device 100 may be precisely shaped and fitted together in order to reduce overall size, reduce mass, and/or increase performance of the electronic device 100. The compact nature of the electronic device 100 may increase the challenge of precisely machining components to create a final product.

Some components of the electronic device 100, such as the housing 102, may interact with a variety of other components, requiring the components to have multiple precision interfaces. The housing 102, for example, may interface with a transparent cover 118 over the display 104, the watch crown 106, one or more buttons 108, the watch band 105, and various other internal and external components of the electronic device 100 (e.g., the display stack or common frame may be coupled to and supported by the housing 102). Each of these interfaces may require precise machining to yield desired performance.

In some embodiments, the electronic device 100 may be constructed to be resistant to entry of liquids (e.g., water) and other contaminants. In such embodiments, the need for precision machining may be heightened. For example, the interface between the housing 102 and the transparent cover 118 may be a press fit or may otherwise resist the entry of contaminants into the housing 102. A compressible seal or structure may be placed between the watch crown 106 and the housing 102 that resists passage of contaminants into internal portions of the watch crown 106 and/or the electronic device 100 while allowing the watch crown 106 to receive rotational inputs. Portions of the compressible seal may collapse and/or bend to allow translational movement of the watch crown 106. The compressible seal may require a precise interface between the housing 102 and the watch crown 106. A similar seal may be included between the button 108 and the housing 102. In general, any opening in the housing 102 may require precision machining to ensure the electronic device 100 remains sealed to prevent or reduce ingress of external contaminants.

These precision components may be formed from brittle or difficult to machine materials, such as ceramics, hardened metals, high hardness metals, sapphire, thermoplastics, composites, and so on. Difficult to machine materials may be desirable for components of the electronic device 100 for particular material properties, such as durability. In particular, it may be desirable to form external surfaces of the electronic device 100 from a hard or durable brittle material or materials. For example, the housing 102 of the electronic device 100 and/or the transparent cover 118 over the display 104 may be formed from a hard or durable material that may be characterized as a brittle material.

In the example of the housing 102 of an electronic device 100, certain brittle materials may be selected for desirable properties, such as appearance, hardness, and durability. For example, by forming the housing 102 from such materials, the electronic device 100 may be less susceptible to damage from contact with other objects while the electronic device 100 is worn by a user. In addition, the electronic device 100 may transmit electromagnetic signals, and a ceramic housing 102 may allow for clear transmission of electromagnetic signals, where a metal would interfere with such transmission. Other materials including hardened steel, stainless steel, titanium or other metal alloys may also provide desirable as appearance, hardness, and durability but also provide desired conductive properties and/or metallic exterior finish.

However, as previously noted, the housing 102 must interface with a number of other components, and each interface may require a level of precision which cannot be achieved during the process of molding and sintering the ceramic material. Accordingly, the housing 102 may include a hard (e.g., ceramic) shell, and a more machinable material (e.g., aluminum, brass, plastic, steel) may be deposited into at least a portion of the shell. The machinable material may then be processed to yield the required precision-machined interface surfaces, as further described below with respect to FIGS. 2A-5L.

The electronic device is shown in FIG. 1 as a wearable electronic device. However, it is understood that this is an example. In various implementations, an electronic device may be any kind of electronic device that uses a difficult to machine component for a high-precision application.

Sample electronic devices include a laptop computer, a desktop computer, a mobile computer, a smart phone, a tablet computer, a fitness monitor, a personal media player, a display, audiovisual equipment, and so on. An additional example of an electronic device with a housing formed from a ceramic or otherwise difficult to machine material is illustrated below with respect to FIGS. 6-7G.

Figure 2A:
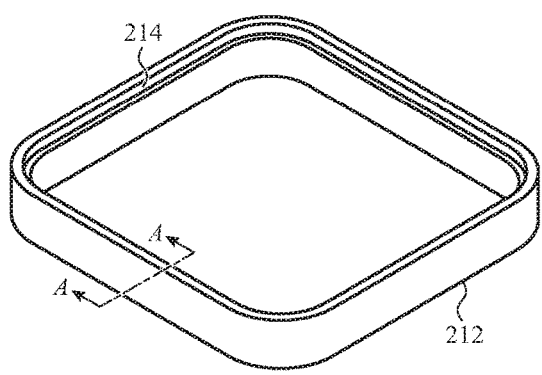
FIG. 2A depicts a perspective view of a shell for a housing of an electronic device.
Figure 2C:
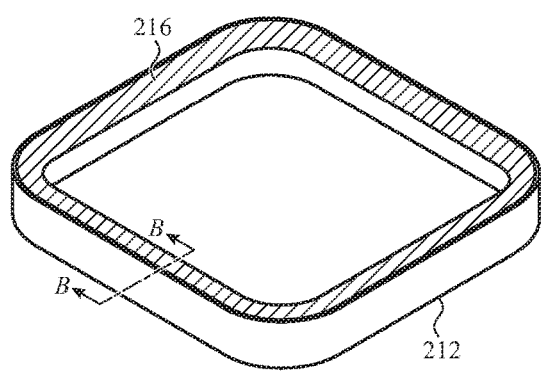
FIG. 2C depicts a perspective view of a shell for a housing, with a machinable material deposited over an attachment point.
Figure 2B:
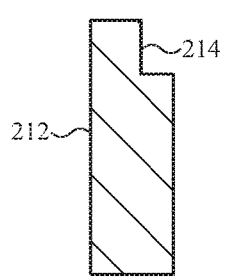
FIG. 2B depicts a cross-sectional view of the shell depicted in FIG. 2A, taken along line A-A.

FIGS. 2A-2H depict an example of a shell of a housing, formed from a brittle or difficult to machine material, as a machinable material is added to an interface to yield a precision interface. FIG. 2A depicts a perspective view of a shell for a housing of an electronic device. FIG. 2B depicts a cross-sectional view of the shell depicted in FIG. 2A, taken along line A-A.

As depicted in FIG. 2A, a component for an electronic device may be formed from a brittle or otherwise difficult to machine material. The brittle component may be a shell 212 for a housing of the electronic device formed from a ceramic material, such as zirconium dioxide, aluminum oxide, silicon carbide, tungsten carbide, porcelain, and any other suitable ceramic material. In other embodiments, a different component may be formed, and/or the component may be formed from another brittle and/or difficult to machine material, such as glass (e.g., soda lime glass, borosilicate glass), glass ceramics, fiber composites (e.g., fiberglass, carbon fiber), hardened metals, hardened steel, high carbon steel, titanium, and so on.

In the case of a ceramic material, a shell 212 is generally produced by mixing the ceramic material into a slurry with water, binder, and deflocculant. The slurry may be placed into a mold, slip, or similar shaping mechanism and pressed to produce a green body (a weakly bound ceramic body, possessing the general shape of the desired product, but not yet hardened). The green body may include structural features of the shell 212, such as a shelf 214, which may be intended as an attachment point for interfacing with another component of the electronic device.

After the green body is formed, it may be sintered to produce the shell 212. In the sintering process, the green body may first be heated at a relatively low temperature to remove binders. Then the green body may be placed under high temperature and other forces, such as pressure and/or electrical current to complete the sintering process. During sintering, the green body may be subject to volumetric shrinking to yield the ceramic shell 212.

After sintering, the shell 212 may be hard and have low machinability. Machinability is a measure of how long a machining tool lasts when processing a particular material. Machinability may be expressed in comparison to another material, such as steel. For example:

$$\text{Machinability index}(\%) = \frac{\text{cutting speed of material for 20 minute tool life}}{\text{cutting speed of standard steel for 20 minute tool life}} \times 100$$

Other measures of machinability may take into account the type of cutting tool required (and its cost), the geometry of the tool, the clamping method required, number of cycles required, the complexity of the finished surface, and so on. Many brittle materials, including ceramics, such as zirconium dioxide and aluminum oxide, have low machinability, requiring a greater amount of time and expense over machinable materials such as aluminum and medium-carbon steel. As an example, the shell may have a machinability index that ranges between 0 and 60% as compared to standard steel (e.g., 1212 carbon steel). In general and as discussed below, the machinability index of the shell is lower than the machinability index of a chassis formed from a machinable material. As an example, the machinable material may have a machinability index that may be approximately 50% or higher as compared to standard steel (e.g., 1212 carbon steel). If the machinable material is more machinable than standard steel (e.g., 1212 carbon steel), the machinability index may be greater than 100%.

The forming and sintering process of a ceramic material may further make achieving precise finished surfaces difficult and costly. As noted above, a green body may be formed from a mold that includes geometric features desired in the shell 212, such as a shelf 214 for attaching another part. When the green body is sintered, it is subject to volumetric shrinking, and the shelf 214 may be produced within a relatively wide variance.

Traditionally, as a result of the limitations of molding and sintering, the green body may be formed with excess material, which material is then removed through machining to produce a finished shelf. As the ceramic material may have a low machinability, even producing a simple shelf within tolerances may be costly and time-consuming.

In order to reduce the cost and time involved to produce finished edges, surfaces, and attachment points, such as the shelf 214, the green body may instead be formed with slightly less material than needed at those points. The green body is sintered to produce the shell 212 with a shelf 214, which may need additional material to meet final specifications for the shell 212.

Figure 2D:
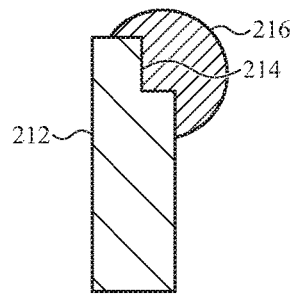
FIG. 2D depicts a cross-sectional view of the shell depicted in FIG. 2C, taken along line B-B.

As depicted in FIGS. 2C and 2D, a machinable material may be added to the component of FIGS. 2A and 2B. FIG. 2C depicts a perspective view of a shell with a machinable material deposited over a shelf, which may serve as an attachment point. FIG. 2D depicts a cross-sectional view of the shell depicted in FIG. 2C, taken along line B-B.

After the shell 212 is produced, a machinable material 216 may be deposited over the shell 212 (e.g., over an interior surface of the shell 212). The machinable material 216 may be any material having a higher machinability than the material (e.g., ceramic) forming the shell 212. For example, the machinable material may be aluminum, brass, machinable steel, medium-carbon steel, brass, plastics, and so on. In general, the machinable material may have a machinability index that may be approximately 50% or higher as compared to standard steel. If the machinable material is more machinable than standard steel, the machinability index may be greater than 100%. In some embodiments, the machinable material may be selected for additional properties, such as conductivity, insularity, capacitance, compliance, stiffness, and other properties which may be desirable for a given application.

The machinable material 216 may be deposited over the shell 212 through an appropriate method. For example, the machinable material 216 may be coupled to the shell by brazing, casting, coating (e.g., plasma spray, thermal spray, cold spray), soldering, plating, vapor deposition, chemical deposition, insert molding, overmolding, 3-D printing, and any other appropriate techniques. In some embodiments, the machinable material 216 may be deposited onto the entire shell 212, and in other embodiments the machinable material 216 may be deposited onto a target area, such as the shelf 214.

In some embodiments, a bond between the machinable material 216 and the shell 212 may be facilitated through an appropriate technique. For example, a surface of the shell 212, such as an interior surface, may be roughened through grinding, etching, or similar techniques prior to addition of the machinable material 216. In another example, an adhesive may facilitate bonding between the machinable material 216 and the shell 212. In another example, the shell may be plated or clad with another material (e.g., a softer material or a material with a lower melting point), which may facilitate forming a bond between the machinable material 216 and the shell 212.

Figure 2E:
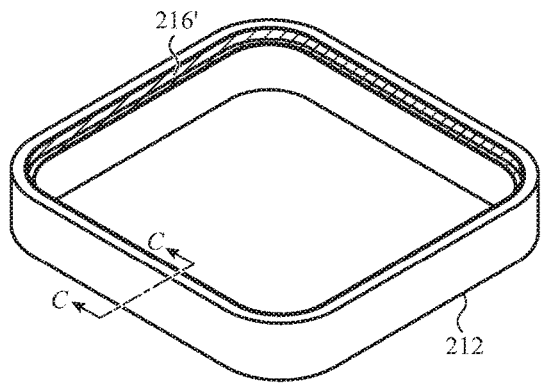
FIG. 2E depicts a perspective view of a shell after processing of the machinable material.
Figure 2G:
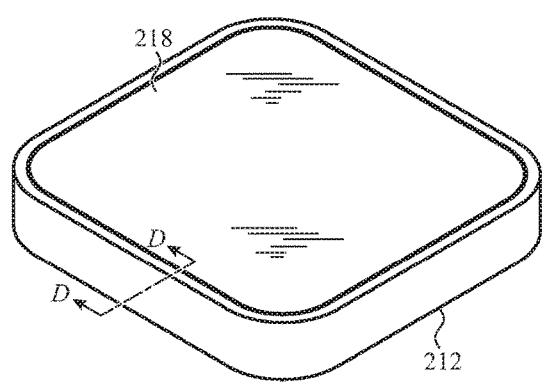
FIG. 2G depicts a perspective view of a shell after fitting a transparent cover within the finished attachment point.
Figure 2F:
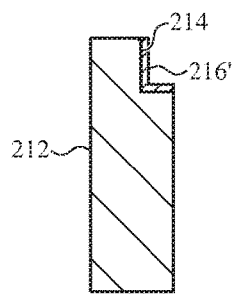
FIG. 2F depicts a cross-sectional view of the shell depicted in FIG. 2E, taken along line C-C.

As depicted in FIGS. 2E and 2F, the machinable material may be processed to produce a finished surface. FIG. 2E depicts a perspective view of a shell after processing of the machinable material. FIG. 2F depicts a cross-sectional view of the shell depicted in FIG. 2E, taken along line C-C.

After the machinable material is deposited over the shell 212, the material may be machined or otherwise processed to produce a finished surface, the machined shelf 216'. For example, the machinable material over the shelf 214 may be selectively removed by milling, grinding, polishing, or otherwise removing portions of the machinable material until the machined shelf 216' is achieved. In some embodiments, the machined shelf 216' may be at least a portion of a machined chassis, which may additionally couple to other components.

Figure 2H:
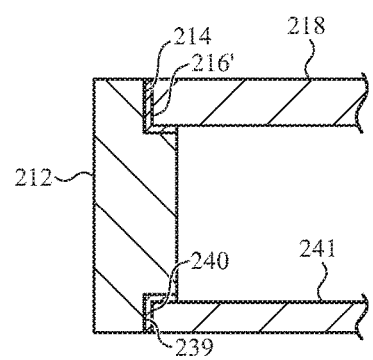
FIG. 2H depicts a cross-sectional view of the shell depicted in FIG. 2G, taken along line D-D.

Once the machined shelf 216' is produced, another component may be coupled to the shell 212 at the machined shelf 216'. FIG. 2G depicts a perspective view of a shell after fitting a transparent cover within an attachment point, such as a machined shelf. FIG. 2H depicts a cross-sectional view of the shell depicted in FIG. 2G, taken along line D-D.

With the machined shelf 216' prepared, the shell 212 may be coupled to another component of the electronic device. For example, the machined shelf 216' may function as a bezel or other retaining mechanism for retaining a transparent cover 218 (e.g., a transparent cover 118 over a display 104, such as depicted in FIG. 1). Accordingly, once the machined shelf 216' is prepared, a transparent cover 218 may be coupled to, bonded to, or otherwise attached to the machined shelf 216'.

In some embodiments, a seal may be formed between the transparent cover 218 and the machined shelf 216'. In some cases, the machinable material of the machined shelf 216' may be a sufficiently compliant material to facilitate a seal. In some cases, a compliant material is positioned on the machined shelf 216' and is configured to interface with the transparent cover 218 to form a seal or barrier. The seal or barrier may reduce or prevent the ingress of external materials including, for example, liquid, moisture, dust, and other potential contaminants. The use of a compliant material for the machined shelf 216' or on the machined shelf 216' may additionally provide impact resistance to one or both of the shell 212 and the transparent cover 218. In some embodiments, the transparent cover 218 may be press fit into a cavity or opening defined, in part, by the machined shelf 216'.

In some embodiments, the machined shelf 216' may additionally or alternatively include a groove, beveled edge, or other attachment feature to facilitate retention of the transparent cover 218. In some embodiments, the transparent cover 218 may be coupled to the machined shelf 216' by another appropriate means, such as application of an adhesive, a retention clip, and so on.

In some embodiments, the machinable material for the machined shelf 216' may be selected for other performance characteristics. For example, the shell 212 and the transparent cover 218 may each be a dielectric material, while the machined shelf 216' may be conductive (e.g., a metal). The machined shelf 216' may in these cases additionally serve as an antenna, conductive material for a sensor, or another purpose.

In some embodiments, the shell 212 may also be shaped to receive a back cover 241. Thus a back shelf 239 may be formed in the shell 212 opposite the shelf 214. A machinable material (e.g., the same or a different machinable material as the machined shelf 216') may be deposited over the back shelf 239 and machined to form an attachment feature, such as a machined back shelf 240. In some embodiments, the machined back shelf 240 may form at least a portion of a machined chassis, which may also include the machined shelf 216'. The back cover 241 may then be coupled to the machined back shelf 240 in a manner such as described above with respect to the transparent cover 218.

Figure 3A:
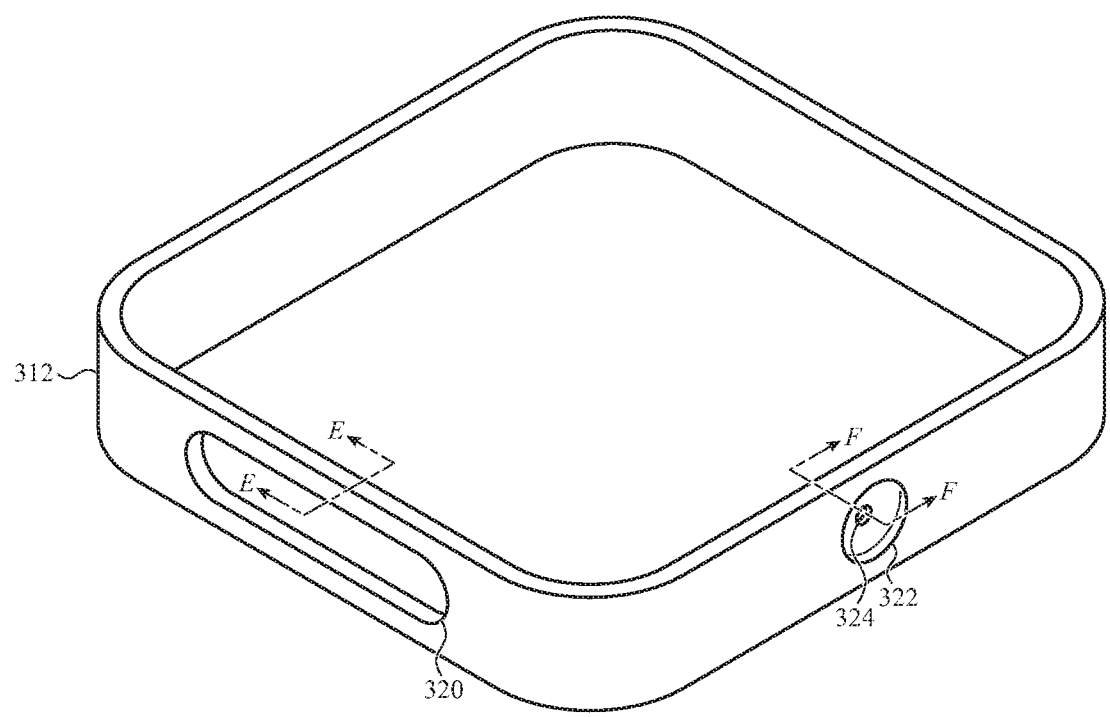
FIG. 3A depicts a perspective view of a shell for a housing, formed with openings for attachment.
Figure 3B:
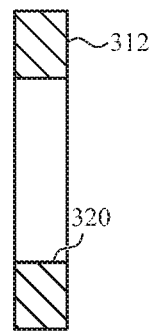
FIG. 3B depicts a cross-sectional view of the shell depicted in FIG. 3A, taken along line E-E.
Figure 3C:
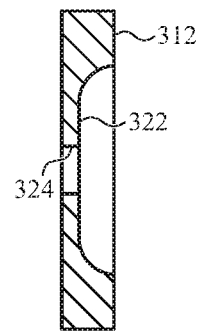
FIG. 3C depicts a cross-sectional view of the shell depicted in FIG. 3A, taken along line F-F.

FIGS. 3A-3F depict an example of a shell for a housing of an electronic device as a machinable material is added to multiple openings to yield precision interfaces. FIG. 3A depicts a perspective view of a shell for a housing, formed with openings for attachment. FIG. 3B depicts a cross-sectional view of the shell depicted in FIG. 3A, taken along line E-E. FIG. 3C depicts a cross-sectional view of the shell depicted in FIG. 3A, taken along line F-F.

As depicted in FIG. 3A, a component, such as a shell 312, for an electronic device may be formed from a brittle or otherwise difficult to machine material. The shell 312 may be formed from a ceramic material in a manner similar to that described above with respect to FIGS. 2A-2F, though the shell 312 can be formed of any difficult to machine material (e.g., hardened steel, stainless steel, titanium). In the example of FIG. 3A, the shell 312 may additionally be molded to define an oblong opening 320 on a first face of the shell 312. A round opening 324 surrounded by a recess 322 may be defined on a second face of the shell 312.

Each of the oblong opening 320 and the round opening 324 may require a precise finish for fitting to other parts (e.g., receiving a component or accessory) of an electronic device. For example, the oblong opening 320 may facilitate a depressible button. The round opening 324 and surrounding recess 322 may facilitate a crown or similar component, which may be rotatable.

The precision surfaces required for the oblong opening 320 and the round opening 324 may be difficult and costly to achieve through molding and machining a housing from ceramic or another brittle material. Accordingly, shell 312 for the housing may be formed, and a machinable material may be deposited in and/or around the oblong opening 320 and the round opening 324 in order to produce precise machined surfaces.

Figure 3D:
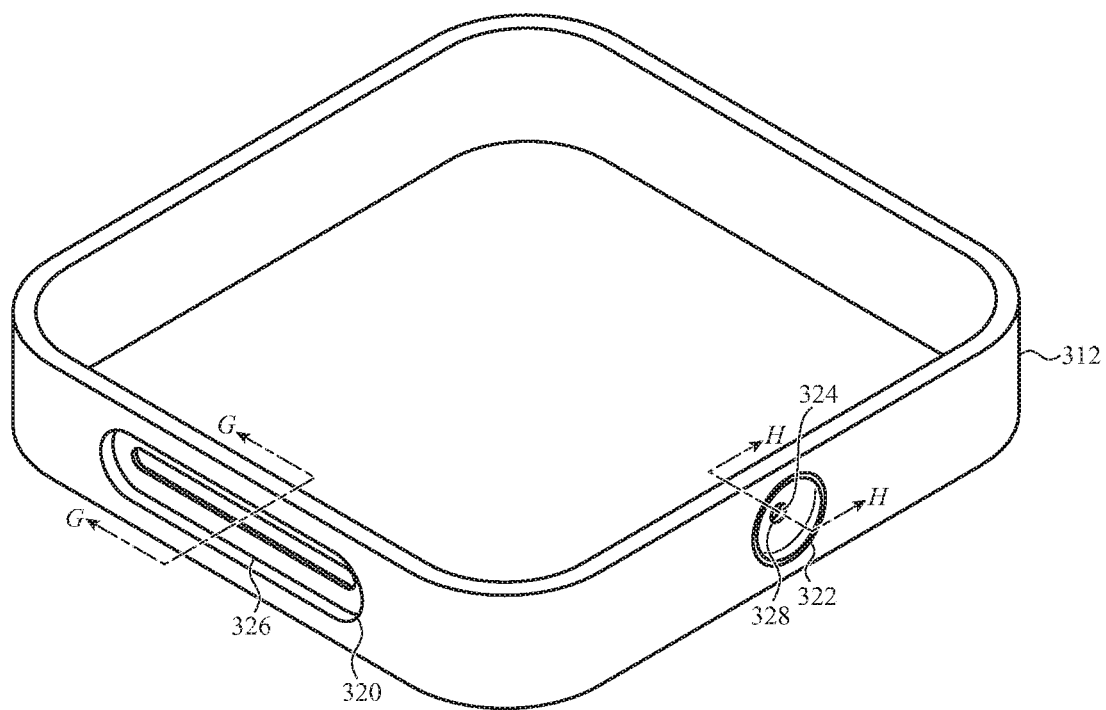
FIG. 3D depicts a perspective view of a shell, after a machinable material is deposited and processed.
Figure 3E:
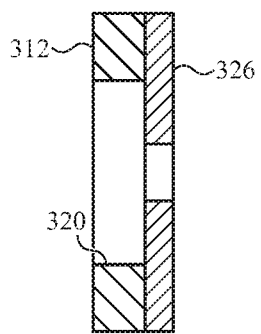
FIG. 3E depicts a cross-sectional view of the shell depicted in FIG. 3D, taken along line G-G.
Figure 3F:
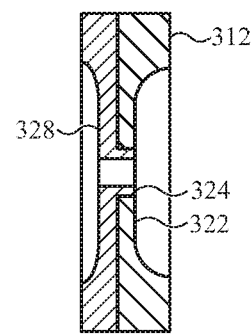
FIG. 3F depicts a cross-sectional view of the shell depicted in FIG. 3D, taken along line H-H.

FIG. 3D depicts a perspective view of a shell, after a machinable material is deposited and processed. FIG. 3E depicts a cross-sectional view of the shell depicted in FIG. 3D, taken along line G-G. FIG. 3F depicts a cross-sectional view of the shell depicted in FIG. 3D, taken along line H-H.

As depicted in FIGS. 3D-3F, a machinable material is deposited onto the shell 312 and processed to produce a button interface 326 within the oblong opening 320, which interfaces with and retains a button or other component. The machinable material also forms a crown shaft interface 328 within the round opening 324, which may function as a bearing surface for a rotatable shaft of a crown and otherwise retain and interface with the crown. In some cases, the machinable material may include a brass, lubricated alloy, or other material suitable for use in a plane or journal bearing.

The oblong opening 320 and the button interface 326 may cooperate as a first and a second portion of an opening. The oblong opening 320 may be the first portion of this opening, which allows a compressible button (e.g., button 108) or other component to be at least partially recessed within the opening. The button interface 326 may be the second portion of this opening, which provides a planar surface within the first portion of the opening and a more precise opening for attachment of the button (or other component) and related components.

The shape of this opening, including the first portion of the oblong opening 320 and the second portion of the button interface 326, may be difficult to mold or machine from the material of the shell 312 (e.g., ceramic). Accordingly, it may significantly reduce cost to form the first portion, the oblong opening 320, with the ceramic shell 312, and form the second portion, the button interface 326, from a machinable material (e.g., aluminum, brass, machinable steel, plastic, etc.).

Similarly, the round opening 324 and the crown shaft interface 328 may cooperate to form a precise through-hole (e.g., opening) for retaining a rotatable crown. The precise size and shape for the through-hole may be similarly difficult to mold or machine from the material of the shell 312. Accordingly, the shell 312 may be molded with the round opening 324 being slightly larger than needed for the crown, and a machinable material may be deposited within the round opening 324. The machinable material may then be machined to form a machined surface, or crown shaft interface 328.

The machined surface of the crown shaft interface 328 may form a bearing, such as a plane bearing or bearing surface, to accommodate a rotatable crown shaft within the round opening 324. In some cases, the machinable material along the crown shaft interface 324 may include a brass, lubricated alloy, or other material suitable for use in a plane or journal bearing. The crown shaft interface 328 may also form a contoured interior surface, which may accommodate internal components of the crown, such as a nut, retaining clip, O-ring, or other retaining or sealing component to facilitate retention of a crown within the shell 312.

In some embodiments, the button interface 328 and/or the crown shaft interface 328 may form at least a portion of a machined chassis. The machined chassis may include additional features for mounting to components of the electronic device.

In some embodiments, the button interface 326 and crown shaft interface 328 may be formed by depositing a block of machinable material onto the shell 312 through an appropriate technique, such as described above with respect to FIGS. 2C and 2D. The block of material may be deposited immediately around each of the oblong opening 320 and the round opening 324, or the block of material may be deposited around the entire shell 312. After the block of machinable material is deposited, the material may be milled, ground, drilled, polished, or otherwise machined to form the button interface 326 and the crown shaft interface 328.

In other embodiments, the button interface 326 and crown shaft interface 328 may each be formed and machined prior to inclusion with the shell 312. The button interface 326 may then be coupled to the shell 312 at or near the oblong opening 320 through an appropriate technique, such as brazing or soldering. The crown shaft interface 328 may similarly be coupled at or near the round opening 324.

In some embodiments, a layer of machinable material may be deposited over an area of the shell 312, such as the interior of the shell 312. The machinable layer may be deposited through an appropriate technique, such as vapor deposition or plating, and form a base for other components to couple to. For example, the button interface 326 may be pre-formed and coupled to the layer of machinable material through brazing or soldering.

Figure 4A:
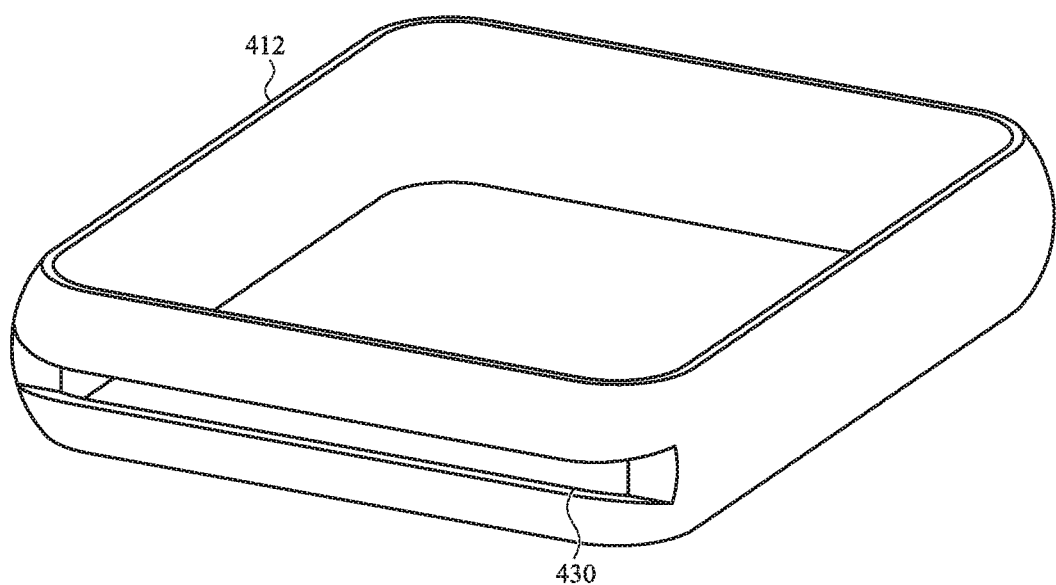
FIG. 4A depicts a perspective view of a shell formed with an opening along a length of the component.
Figure 4B:
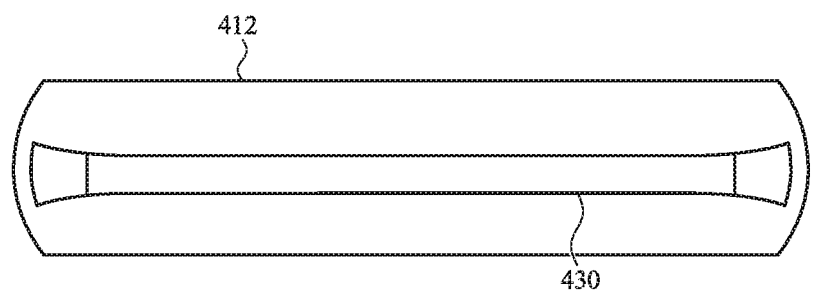
FIG. 4B depicts a front view of the shell of FIG. 4A.
Figure 4C:
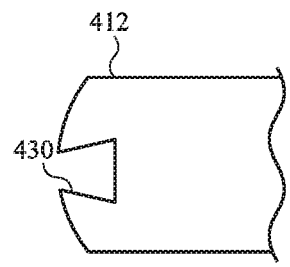
FIG. 4C depicts a side view of the shell of FIG. 4A.

FIGS. 4A-4G depict an example of a shell on which a complex interface geometry is formed. FIG. 4A depicts a perspective view of a shell formed with an opening along a length of the component. FIG. 4B depicts a front view of the shell of FIG. 4A. FIG. 4C depicts a side view of the shell depicted in FIG. 4A.

As depicted in FIGS. 4A-4C, a component 412 for an electronic device may be formed from a brittle or otherwise difficult to machine material. The shell 412 may be formed from a ceramic material in a manner similar to that described above with respect to FIGS. 2A-2F, though the shell can be formed of any difficult to machine material (e.g., stainless steel, hardened steel, high-carbon steel, titanium). In the example of FIGS. 4A-4D, the shell 412 may additionally be molded to define an opening 430 along its length.

The opening 430 may be included to facilitate receiving a component or accessory, such as a watch band, within the shell 412. The opening 430 may require a complex geometry which could not be molded into the shell 412. Such a complex geometry may additionally be very costly to obtain by machining the shell 412.

Accordingly, the shell 412 may be shaped to include the opening 430 along its length. As depicted in FIG. 4C, in some embodiments the opening 430 may be molded or machined to include an undercut, wherein an interior width of the opening 430 is greater than the width of the opening 430 at the external surface. Additional complex geometry of the opening may be supplied through the addition of a machinable material.

Figure 4D:
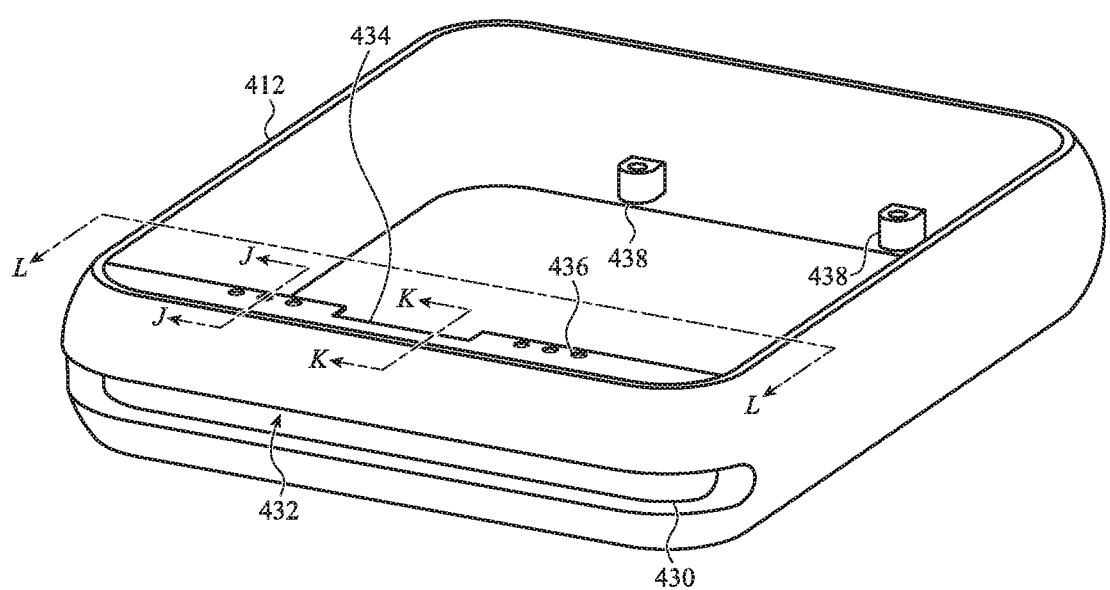
FIG. 4D depicts a perspective view of a shell over which a complex interface geometry has been formed.
Figure 4E:
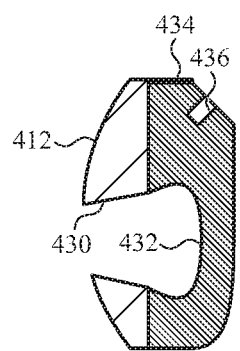
FIG. 4E depicts a cross-sectional view of the shell depicted in FIG. 4D, taken along line J-J.
Figure 4F:
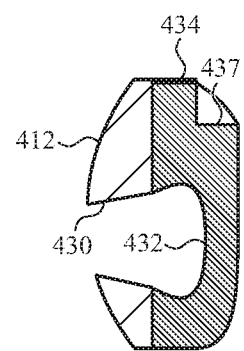
FIG. 4F depicts a cross-sectional view of the shell depicted in FIG. 4D, taken along line K-K.
Figure 4G:
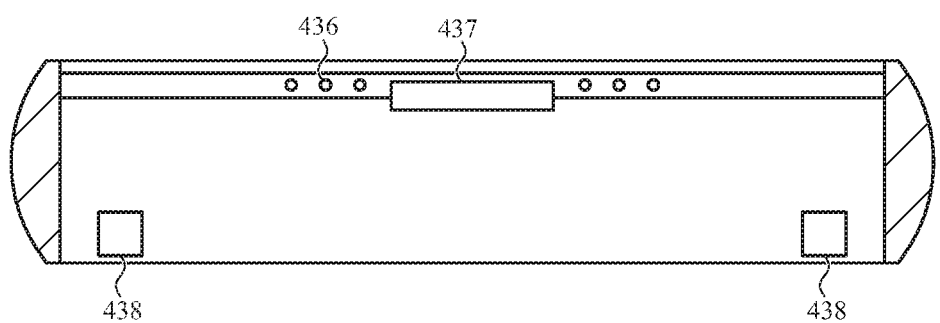
FIG. 4G depicts a cross-sectional view of the shell depicted in FIG. 4D, taken along line L-L.

FIG. 4D depicts a perspective view of a shell over which a complex interface geometry has been formed using a machinable material. FIG. 4E depicts a cross-sectional view of the shell of FIG. 4D, taken along line J-J. FIG. 4F depicts a cross-sectional view of the shell depicted in FIG. 4D, taken along line K-K. FIG. 4G depicts a cross-sectional view of the shell depicted in FIG. 4E, taken along line L-L.

As depicted in FIGS. 4E-4H, a machinable material is deposited onto the shell 412 and processed to produce a contoured surface 432, an internal chassis 434 (e.g., a machined chassis), attachment features 436, additional mounting points 438 (e.g., a screw boss, a bracket with a threaded aperture, and so on), and a ledge 437. The contoured surface 432 may be formed within the opening 430 along the length of the shell 412. The internal chassis 434 may be formed from the same material (e.g., from a same block of material) on the interior of the shell 412.

The contoured surface 432 may form a precise shape to which a component or accessory of the electronic device attaches, such as a watch band (e.g., watch band 105 depicted in FIG. 1). The contoured surface 432 may have a maximum interior width which is greater than a width at the surface of the opening 430, and the shape of the contoured surface 432 may be difficult and/or costly to mold or machine from the material of the shell 412. Accordingly, the cost of producing the contoured surface 432 in a precise shape may be significantly reduced by forming a first portion of an opening by the opening 430 in the shell 412 (e.g., by molding and/or simple machining processes), and to form a second portion of the opening, the shape of the contoured surface 432, from a machinable material.

The difficulty of machining the shell 412, may be compounded by the need for forming an internal chassis 434 on the internal surface of the shell 412 opposite the opening 430. The internal chassis 434 may include attachment features 436, such as threaded apertures to which internal components of the electronic device (e.g., components of the display stack, sensors, input/output ports, acoustic components, haptic components, digital and/or analog circuits) are mounted. One or more recesses, such as a ledge 437, may also be included to facilitate placement of internal components of the electronic device.

The geometry of the internal chassis 434 may require a multi-stage and costly machining process, in which a great deal of brittle material may need to be removed at a relatively slow pace. By creating a shell 412 with the simple opening 430, however, the machining cost may be greatly reduced as both the contoured surface 432 and the internal chassis 434 are formed and machined from a more machinable material (e.g., aluminum or machine steel).

In some embodiments, the contoured surface 432 and internal chassis 434 may be formed by depositing a block of machinable material onto the interior of the shell 412 through an appropriate technique, such as described above with respect to FIGS. 2C and 2D. The block of material may be deposited immediately around the opening 430, or the block of material may be deposited around the entire shell 412. After the block of machinable material is deposited, the material may be milled, ground, drilled, polished, or otherwise machined to form the contoured surface 432 and internal chassis 434.

In other embodiments, the contoured surface 432 and internal chassis 434 may be formed and machined prior to inclusion with the shell 412. The part including the contoured surface 432 and internal chassis 434 may then be coupled to the shell 412 at or near the opening 430 through an appropriate technique, such as brazing or soldering.

In some embodiments, a layer of machinable material may be deposited over an area of the shell 412, such as the interior surface of the shell 412. The layer of machinable material may be deposited through an appropriate technique, such as vapor deposition or plating, and form a base for other components to couple to and/or be machined from. For example, the contoured surface 432 and internal chassis 434 may be machined into the layer of machinable material. Additional mounting points 438 (e.g., screw bosses, brackets, or the like) may be formed integral with the layer of machinable material, or may be pre-formed and coupled to the layer of machinable material through brazing, soldering, or similar techniques (see, e.g., FIGS. 5F-5K). The additional mounting points 438 may couple to an internal support frame, a circuit board, or other internal components of the electronic device.

Figure 5A:
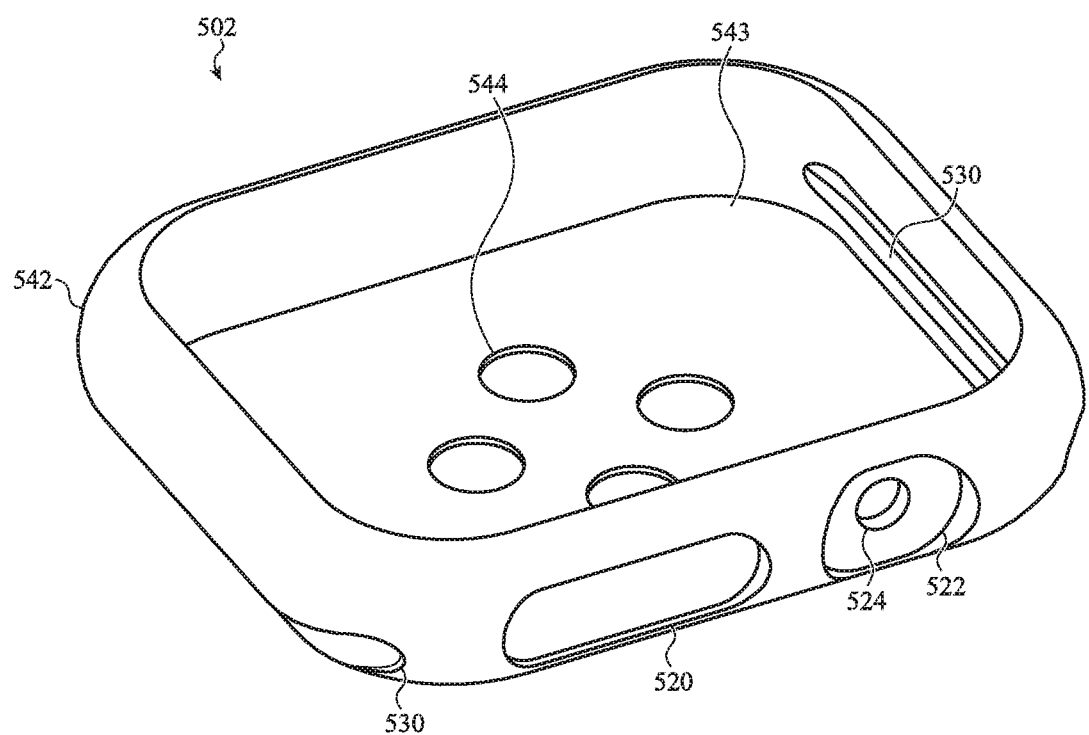
FIG. 5A depicts a perspective view of a shell formed from a brittle material for a housing of an electronic device.
Figure 5B:
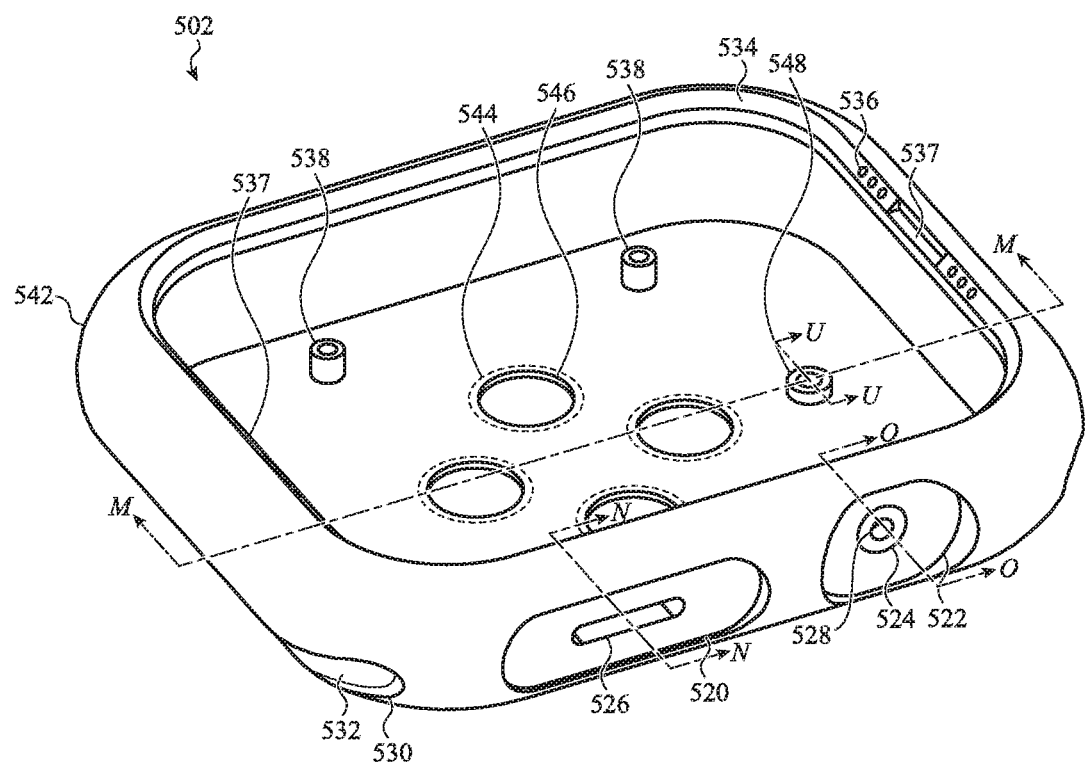
FIG. 5B depicts the housing after a machinable material has been added to the shell and processed.

FIGS. 5A-5L depict an example of a housing of an electronic device, including a shell formed from a brittle material. FIG. 5A depicts a perspective view of the shell formed from the brittle material. FIG. 5B depicts the housing after a machinable material has been added to the shell and processed.

Figure 5C:
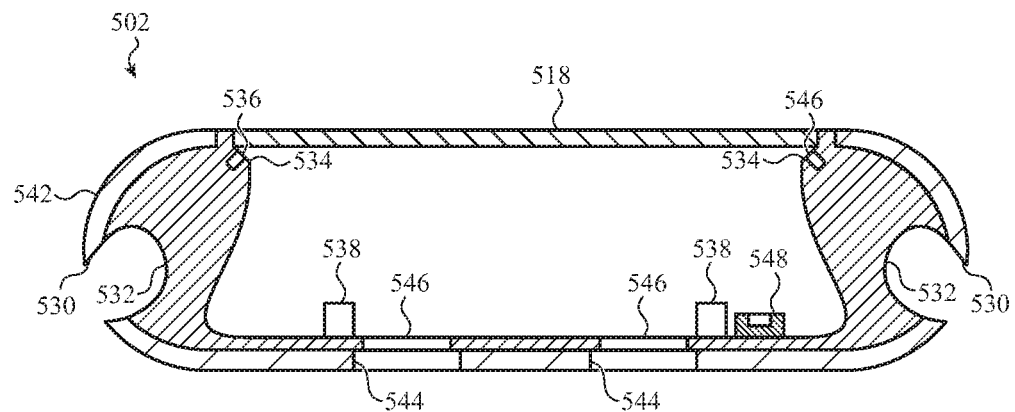
FIG. 5C depicts a cross-sectional view of the housing depicted in FIG. 5B, taken along line M-M.
Figure 5D:
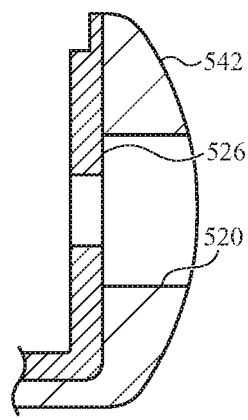
FIG. 5D depicts a cross-sectional view of the housing depicted in FIG. 5B, taken along line N-N.
Figure 5E:
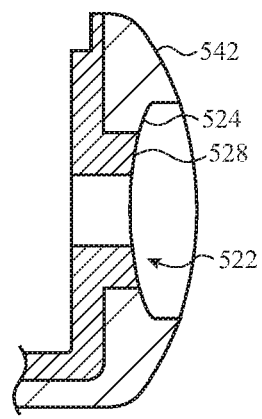
FIG. 5E depicts a cross-sectional view of the housing depicted in FIG. 5B, taken along line O-O.

FIG. 5C depicts a cross-sectional view of the housing depicted in FIG. 5B, taken along line M-M. FIG. 5D depicts a cross-sectional view of the housing depicted in FIG. 5B, taken along line N-N. FIG. 5E depicts a cross-sectional view of the housing depicted in FIG. 5B, taken along line O-O. FIGS. 5F-5K depict a cross-sectional view of the housing depicted in FIG. 5B, taken along line U-U, illustrating example techniques for forming a mounting feature. FIG. 5L depicts the housing of FIG. 5B, illustrating additional components which interface with the processed machinable material.

As depicted in FIG. 5A, it may be desirable to form a housing 502 for an electronic device from a brittle or otherwise difficult to machine material. However, given the difficulty of machining a housing entirely from this material, the external surface of the housing 502 may be a shell 542 of brittle material. The shell 542 may be formed from a ceramic material in a manner similar to the shell described above with respect to FIGS. 2A-2F, though the shell 542 can be formed of any difficult to machine material (e.g., stainless steel, hardened steel, high-carbon steel, titanium).

FIG. 5A may illustrate, for example, a ceramic shell 542 of a housing 502 after the green body of the shell 542 has been sintered to form a hardened, durable external surface for an electronic device. The shell 542 has been shaped (e.g., cast or molded) with a substantially uniform cross-section to enclose features of the electronic device, having four sides and a back surface 543. Various features may be included in the sintered ceramic shell 542, such as openings 530 along the length of two opposing sides (e.g., openings for retaining a watch band, such as watch band 105 depicted in FIG. 1).

An additional side of the shell 542 may include an oblong opening 520 (e.g., an opening for retaining a depressible button, such as button 108 depicted in FIG. 1) and a round opening 524 surrounded by a recess 522 (e.g., for interfacing with a watch crown, such as watch crown 106 depicted in FIG. 1).

In some embodiments, the shell 542 may include a back surface 543. The back surface 543 may be continuous with each of the sides, and may provide structural support to the sides of the shell 542 and/or to internal components of the electronic device. The back surface may include one or more openings 544, which may house sensors or other components of the electronic device (e.g., optical sensors forming an optical heart rate monitor).

The shell 542 may be formed with the above openings and other features to facilitate interaction with input/output components of the electronic device, and may additionally facilitate the formation of mounting points and other internal features needed to retain components of the electronic device. The geometry of the final interfaces and internal features around the features of the shell 542 may require complicated and/or precise geometries which may not be achieved through the forming of the shell 542 (e.g., by sintering). Accordingly, the final interfaces and internal features of the shell 542 may be supplied through the addition and processing of a machinable material.

As depicted in FIGS. 5B and 5C, a machinable material is deposited into the shell 542 and processed to produce various final interfaces for the housing 502. In many embodiments, the machinable material forms a machined chassis. The machined chassis may include a contoured surface 532 and an internal chassis 534 formed on two sides the shell 542. The contoured surface 532 and internal chassis 534 may be formed within the opening 530 along the length of each side of the shell 542.

The contoured surface 532 may form a precise shape to which a component or accessory of the electronic device attaches, such as a watch band (e.g., watch band 105 depicted in FIG. 1). The shape of the contoured surface 532 (e.g., a curved indentation upward into the shell 542, having a maximum width which is greater than a width at the surface of the opening 530) may be difficult and/or costly to mold or machine from the material of the shell 542 (e.g., a ceramic or otherwise difficult to machine material). Accordingly, the contoured surface 532 may be formed by depositing and machining a machinable material within a simple opening 530 in the shell 542. Thus, an opening for retaining a watch band or other accessory may be formed with the opening 530 as a first portion of the opening, and the contoured surface 532 of the chassis as a second portion of the opening.

Similar to the embodiment depicted in FIGS. 4D-4G, the contoured surface 532 may adjoin an internal chassis 534. The geometry of the internal chassis 534 and the contoured surface 532 may require a multi-stage and costly machining process, in which a great deal of brittle material may need to be removed at a relatively slow pace. By creating a shell 542 for the housing 502 with the simple opening 530, however, the machining cost may be greatly reduced as both the contoured surface 532 and the internal chassis 534 are formed and machined from a more machinable material (e.g., aluminum or machine steel).

The internal chassis 534 may also be shaped to include attachment features 536, such as threaded apertures to which internal components of the electronic device (e.g., components of the display stack, sensors, input/output ports, acoustic components, haptic components, digital and/or analog circuits) are mounted. One or more recesses, such as a ledge 537, may also be included to facilitate placement of internal components of the electronic device. The internal chassis 534 may include additional apertures, planar surfaces, shaped surfaces, protrusions, mounting points, and other features to facilitate the attachment of internal components to the housing 502.

As another example, depicted in FIGS. 5B-5E, a machinable material is deposited onto the shell 542 and processed to produce a machined chassis, including a button interface 526 within the oblong opening 520 and a crown shaft interface 528 within the round opening 524. The button interface 526 and the crown shaft interface 528 may form shapes which are difficult to mold or machine from the material of the shell 542 (e.g., ceramic). Accordingly, it may significantly reduce cost to form the oblong opening 520 and the round opening 524, and form the more complex button interface 526 from the machined chassis.

With the machined chassis coupled to the shell 542, the oblong opening 520 and the button interface 526 may cooperate as a first and a second portion of an opening. The oblong opening 520 may be the first portion of this opening, which allows a compressible button (e.g., button 108) or other component to be at least partially recessed within the opening. The button interface 526 may be the second portion of this opening, which provides a planar surface within the first portion of the opening and a more precise opening for attachment of the button (or other component) and related components.

Similarly, the round opening 524 and the crown shaft interface 528 may cooperate to form a precise through-hole (e.g., opening) for retaining a rotatable crown. The shell 542 may be molded with the round opening 524 being slightly larger than needed for the crown, and the machined chassis may be formed within the round opening 524. The machined chassis within the round opening may form a machined surface, or crown shaft interface 528.

The machined surface of the crown shaft interface 528 may form a bearing, such as a plane bearing or bearing surface, to accommodate a rotatable crown shaft within the round opening 524. The recess 522 may be formed at least partially from the machinable material of the machined chassis as well. For example, after the machinable material is deposited within the shell 542, the shell 542 and the machinable material may be machined to form the recess 522, which partially recesses a crown knob within the shell 542.

The internal chassis 534 may also include a shelf 516 or other attachment point for coupling a transparent cover 518, as depicted in FIG. 5C. For example, the shelf 516 may be formed as a bezel or other retaining mechanism for retaining a transparent cover 518 (e.g., a transparent cover 118 over a display 104, such as depicted in FIG. 1). In some embodiments, the transparent cover 518 may be press fit within the shelf 516 formed in the internal chassis 534. Accordingly, the machinable material of the shelf 516 and the machined chassis may be a sufficiently compliant material to facilitate a seal to reduce or prevent ingress of contaminants into the housing 502. The shelf 516 may additionally or alternatively include a groove, beveled edge, or other attachment feature to facilitate retention of the transparent cover 518. In some embodiments, the transparent cover 518 may be coupled to the internal chassis 534 by another appropriate means, such as application of an adhesive, retention clip, and so on.

The back surface of the shell 542 may include one or more sensor openings 544 to house sensors or other components of the electronic device (e.g., optical sensors forming an optical heart rate monitor). A machinable layer or machined chassis may be deposited over the back surface to form a sensor interface 546 within the sensor openings 544 to provide a mounting surface for the sensors. Additional mounting features 548 (e.g., mounting points, mounting surfaces, screw bosses, protrusions, and so on) may be formed on or coupled to the back surface in order to facilitate attachment of components to the housing 502.

In some embodiments, the contoured surface 532, internal chassis 534, button interface 526, crown shaft interface 528, sensor interface 546, and other machined features may be formed by depositing a block of machinable material onto the interior of the shell 542 through an appropriate technique, such as described above with respect to FIGS. 2C and 2D. The block of material may be deposited around the internal surface of the shell 542. In some embodiments, the block of material may additionally be deposited on the back surface of the shell 542. After the block of machinable material is deposited, the material may be milled, ground, drilled, polished, or otherwise machined to form a machined chassis, including the contoured surface 532, internal chassis 534, button interface 526, crown shaft interface 528, sensor interface 546, and other machined features of the housing 502.

In other embodiments, all or portions of the machined chassis may be formed and machined prior to inclusion with the shell 542. For example, the internal chassis 534 may be formed and then be coupled to the internal surface of the shell 542 through an appropriate technique, such as brazing or soldering.

In some embodiments, a layer of machinable material may be deposited over an area of the shell 542, such as the interior surface and/or back surface of the shell 542. The layer of machinable material may be deposited through an appropriate technique, such as vapor deposition or plating, and form a base for other components to couple to and/or be machined from. For example, the contoured surface 532 and internal chassis 534 may be machined into the layer of machinable material. Mounting points 538 (e.g., mounting points for coupling to an internal support frame or other internal components) and additional mounting features 548 may be formed integral with the layer of machinable material, or may be pre-formed and coupled to the layer of machinable material through brazing, soldering, or similar techniques (see, e.g., FIGS. 5F-5K)

FIGS. 5F-5K illustrate example techniques for forming a mounting feature, mounting point, or the like, depicted as example cross-sectional views of the housing depicted in FIG. 5B, taken along line U-U. As depicted, various techniques for forming and/or attaching a mounting feature 548. A mounting feature 548 may be a threaded boss, nut, collar, stud, pin, standoff, or similar fastener or feature that facilitates mounting or an interface with components of the electronic device.

Figure 5F:
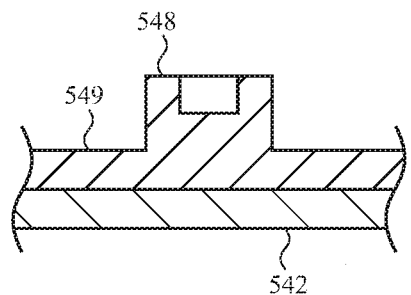
FIG. 5F depicts a cross-sectional view of the housing depicted in FIG. 5B, taken along line U-U, illustrating an example technique for forming a mounting feature.

An example mounting feature 548 may be a (threaded) boss, and may be integrally formed with the machinable layer 549, as depicted in FIG. 5F. The mounting feature 548 may be cast, molded, or otherwise formed as part of the machinable layer 549. As discussed previously, the machinable layer 549 may be coupled to the shell 542. In some embodiments, the machinable layer 549 may be deposited over the shell, and material may be removed from the machinable layer 549 through an appropriate technique to form or define the mounting feature 548.

Figure 5G:
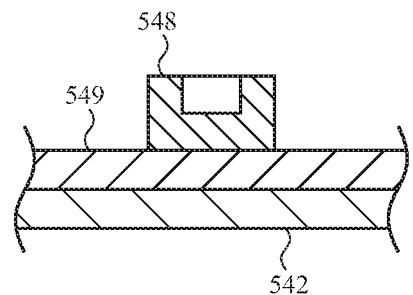
FIG. 5G depicts a cross-sectional view of the housing depicted in FIG. 5B, taken along line U-U, illustrating an example technique for forming a mounting feature.
Figure 5H:
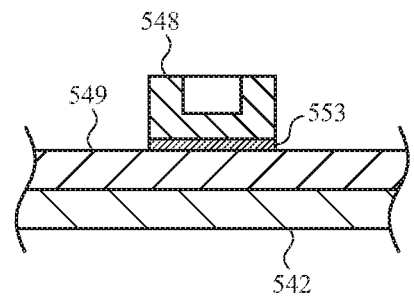
FIG. 5H depicts a cross-sectional view of the housing depicted in FIG. 5B, taken along line U-U, illustrating an example technique for forming a mounting feature.

In some embodiments, a mounting feature 548 may be formed separately from the machinable layer 549 and coupled to the machinable layer 549, as depicted in FIGS. 5G-5K. In some cases, the mounting feature 548 may be soldered or brazed to the machinable layer 549, as depicted in FIG. 5G. In other cases, an adhesive 553 may couple the mounting feature 548 to the machinable layer 549. The adhesive 553 may be an appropriate adhesive for bonding the mounting feature 548 and the machinable layer 549, such as an epoxy, a pressure sensitive adhesive, a thermal set adhesive, or other similar type of bonding agent.

Figure 5I:
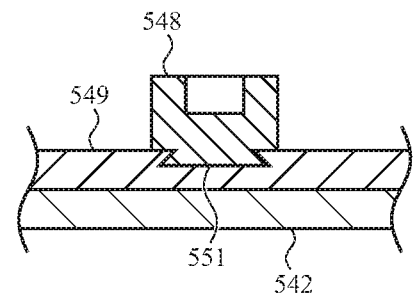
FIG. 5I depicts a cross-sectional view of the housing depicted in FIG. 5B, taken along line U-U, illustrating an example technique for forming a mounting feature.

In some embodiments, the machinable layer 549 may be configured to facilitate a structural or mechanical interlock between the mounting feature 548 and the machinable layer 549. For example, as depicted in FIG. 5I, an undercut 551, knurl, beveled edge, groove, or similar attachment feature or combination of attachment features may be formed within a recess. The undercut 551 or similar attachment feature may retain the mounting feature 548 to the machinable layer 549. In some cases, the mounting feature 548 includes a combination of a structural interlock and an adhesive, braze, or other bonding agent to retain the mounting feature 548 to the machinable layer 549.

Figure 5J:
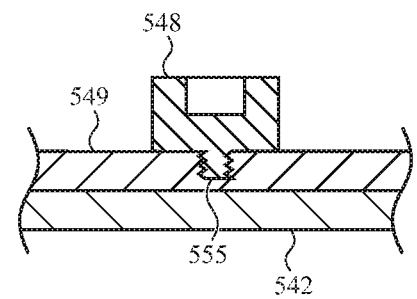
FIG. 5J depicts a cross-sectional view of the housing depicted in FIG. 5B, taken along line U-U, illustrating an example technique for forming a mounting feature.
Figure 5K:
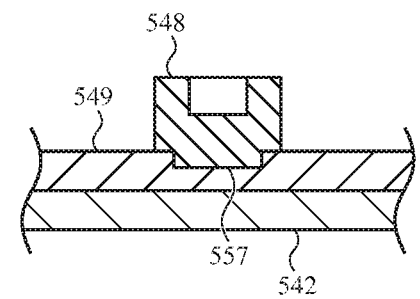
FIG. 5K depicts a cross-sectional view of the housing depicted in FIG. 5B, taken along line U-U, illustrating an example technique for forming a mounting feature.
Figure 5L:
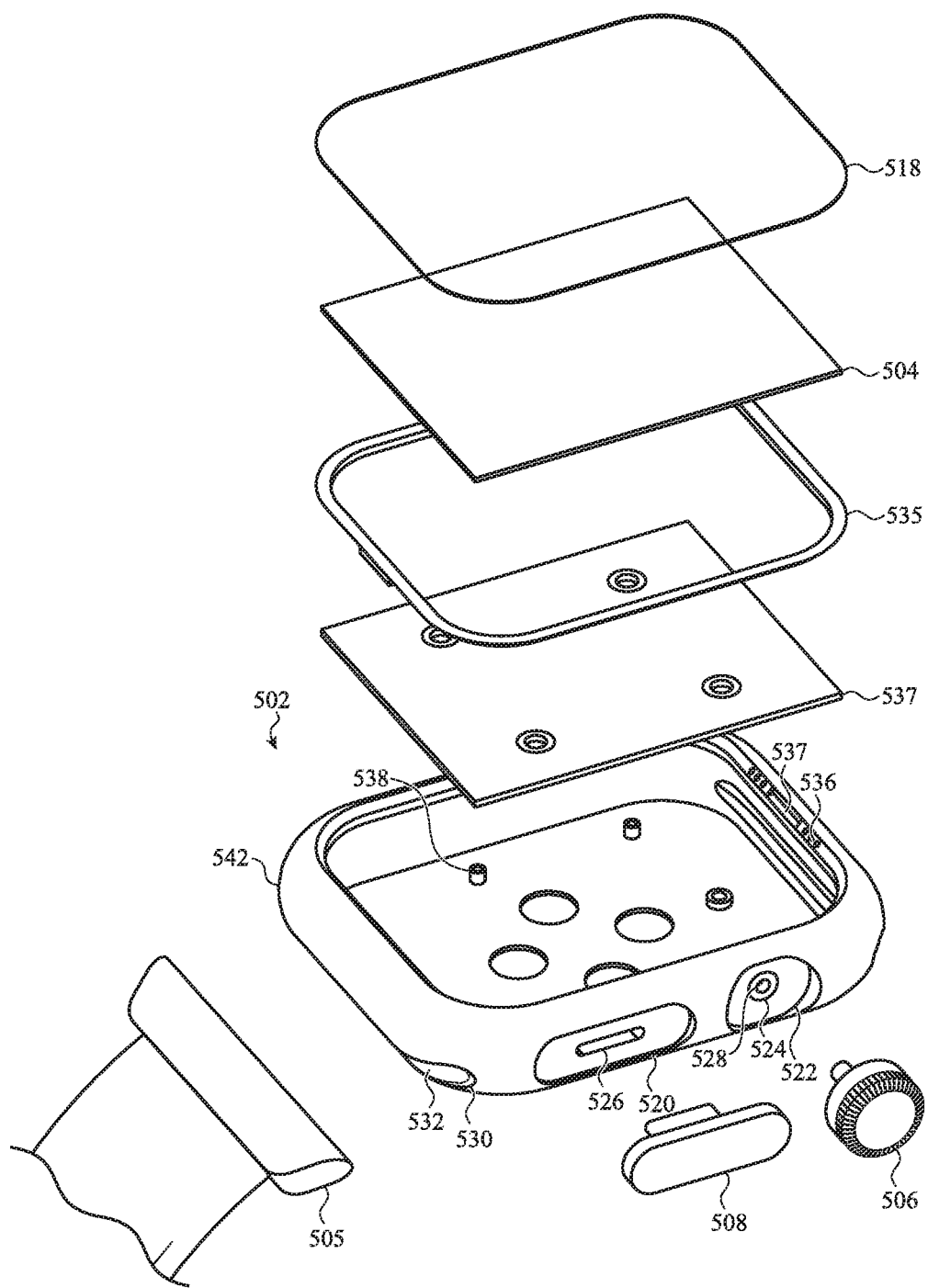
FIG. 5L depicts the housing of FIG. 5B, illustrating additional components which interface with the processed machinable material.

In some embodiments, as depicted in FIG. 5J, a threaded recess 555 may be formed in the machinable layer 549. The mounting feature 548 may be coupled to the machinable layer by mating corresponding threads on the mounting feature 548 to the threaded recess 555. In still other embodiments, a recess 557 may be formed with or without attachment features, as depicted in FIG. 5K, and the mounting feature 548 may be press fit into the recess 557.

It should be understood that the techniques for forming or attaching mounting features illustrated and described with respect to FIGS. 5F-5K are illustrative in nature. A variety of similar techniques may be employed in order to form a mounting feature and/or attach it to the machinable layer. Additionally, one or more of the examples of FIGS. 5F-5K may be used in combination in any particular implementation.

Turning to FIG. 5L, the mounting points, mounting features, and precision interfaces formed in or attached to the processed machinable material may facilitate attachment of components to the housing. The housing 502 may be similar to the housing 502 depicted in FIG. 5B, including a shell 542, chassis 534, and other features. The chassis and other features may be formed from a machinable material using techniques described above.

Once precision interfaces and mounting features are formed in the shell 542, additional components may be coupled to the shell 542. For example, a watch band 505 may couple to the contoured surface 532 formed within the opening 530. Additional attachment features may retain the watch band 505 within the contoured surface 532, such as a latch or pin. A button 508 may couple to the button interface 526, and a watch crown 506 may couple to the crown shaft interface 528.

In addition, internal components of the electronic device may be coupled to the housing 502. For example, a circuit board 533 or similar component may couple to mounting points 538. A support frame 535 may couple to the chassis 534, such as through the ledge 537 and adjacent attachment features 536. The support frame 535 may support the components of a display 504, and may also add structural support to the housing 502.

In some embodiments, a transparent cover 518 may be positioned over the display 504. The transparent cover 518 may protect the display and internal components, and may additionally function as an input surface that receives touch and/or force inputs. As described above, the transparent cover 518 may couple to the shelf 516, and may be press fit or otherwise retained within the shelf 516 (e.g., the shelf 516 may include a groove or beveled edge, an adhesive, or retention clip may be coupled the transparent cover 518 to the shelf 516.

Some embodiments of the housing 502 may include fewer or more precision interfaces, mounting points, and other mounting features. For example, precision surfaces may be required on or around a camera assembly, connector opening, circuit board mounting, battery enclosure, SIM card receiver, and other interface points requiring high tolerances which may not be achieved through the process of forming the shell 542. In addition, in some embodiments a compliant or other material may be deposited within openings in the shell 542 or otherwise coupled to the shell 542 to increase the performance of the housing 502 (e.g., increasing impact resistance, increasing environmental adaptability, pre-stressing the shell 542).

Figure 6:
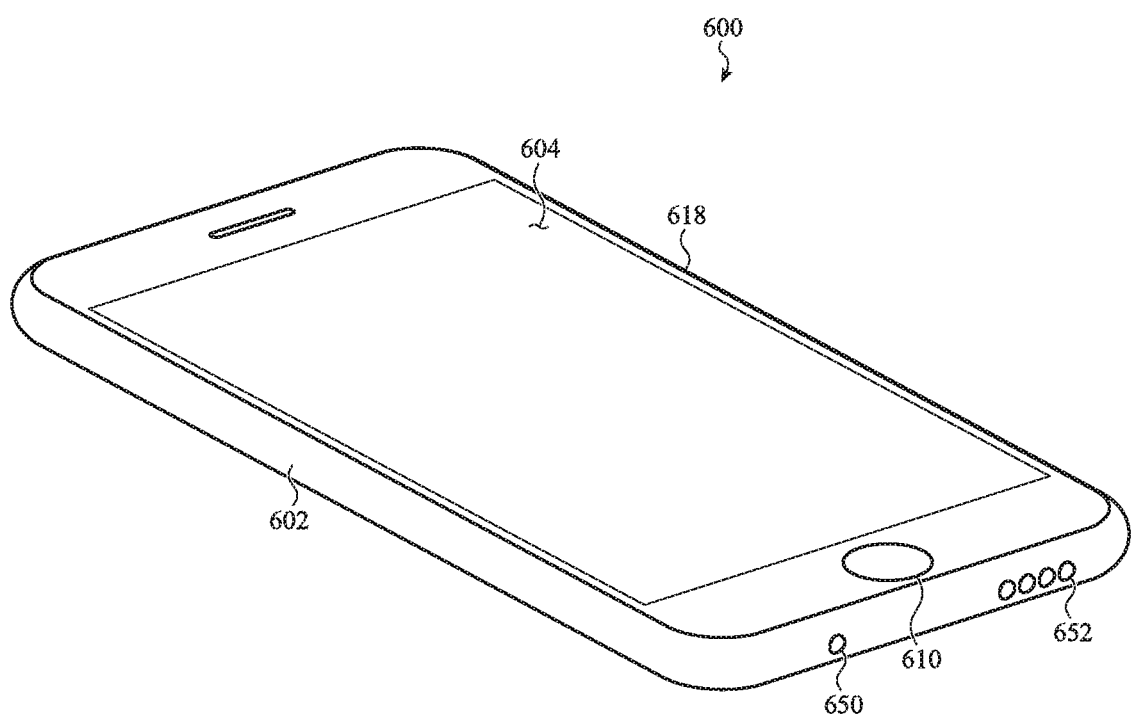
FIG. 6 depicts another example electronic device in the form of a portable electronic device incorporating a shell for a housing according to the present disclosure.

FIG. 6 depicts another example electronic device in the form of a portable electronic device incorporating a shell for a housing according to the present disclosure. As shown in FIG. 6, the electronic device 600 includes a housing 602 to retain, support, and/or enclose various components of the electronic device 600, such as a display 604. The display 604 can provide a visual output to the user. The display 604 can be implemented with any suitable technology, such as described above with respect to FIG. 1.

A transparent cover 618 may be positioned over the front surface (or a portion of the front surface) of the electronic device 600. At least a portion of the transparent cover 618 can function as an input surface 606 that receives touch and/or force inputs. Various layers of a display stack (such as the transparent cover 618, display 604, touch sensor layer, and so on) may be adhered together with an optically transparent adhesive and/or may be supported by a common frame or portion of the housing 602. The display stack may be similar to that described above with respect to FIG. 1.

In many cases, the electronic device 600 can also include a processor, memory, power supply and/or battery, network connections, sensors, input/output ports, acoustic components, haptic components, digital and/or analog circuits for performing and/or coordinating tasks of the electronic device 600, and so on. For simplicity of illustration, the electronic device 600 is depicted in FIG. 6 without many of these components, each of which may be included, partially and/or entirely, within the housing 602.

The electronic device may be operable to receive additional input from a user, such as through an input/output device 610. In some embodiments, the input/output device 610 may be implemented as a mechanical button, while in other embodiments the input/output device 610 may be implemented as a touch and/or force sensitive region of the electronic device 600. Additional buttons, switches, and other input-output devices may also be included.

Similar to the electronic device 100 depicted in FIG. 1, the electronic device 600 may be compact, lightweight, and durably constructed. Accordingly, components of the electronic device 600 may be precisely shaped and fitted together in order to reduce overall size, reduce mass, and/or increase performance of the electronic device 600. Components of the electronic device 600, such as the housing 602, may interact with a variety of other components, requiring the components to have multiple precision interfaces.

For example, the housing 602 may interface with a transparent cover 618 over the display 604, a back cover, and/or various other internal and external components of the electronic device 600 (e.g., the display stack or common frame may be coupled to and supported by the housing 602, external buttons, and so on). Each of these interfaces may require precise machining to yield desired performance. Similar to the electronic device 100 of FIG. 1, the electronic device 600 may be constructed to be resistant to entry of liquids and other contaminants. In such embodiments, the need for precision machining may be heightened in order to maintain the electronic device 600 sealed.

Precision components may be formed from brittle or difficult to machine materials, such as ceramics. Accordingly, a more machinable material may be deposited over at least a portion of brittle components (such as the housing 602), which may then be processed to yield the required precision-machined interface surfaces, as further described below with respect to FIGS. 7A-7G.

Figure 7A:
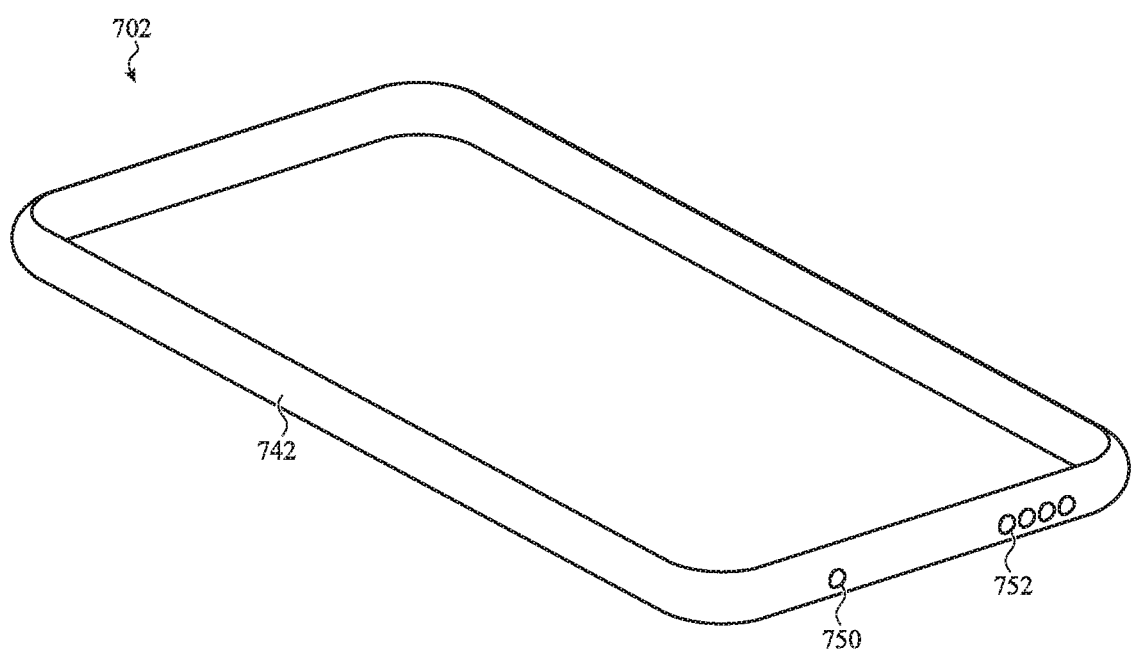
FIG. 7A depicts a perspective view of a housing of an electronic device formed from a brittle material.
Figure 7B:
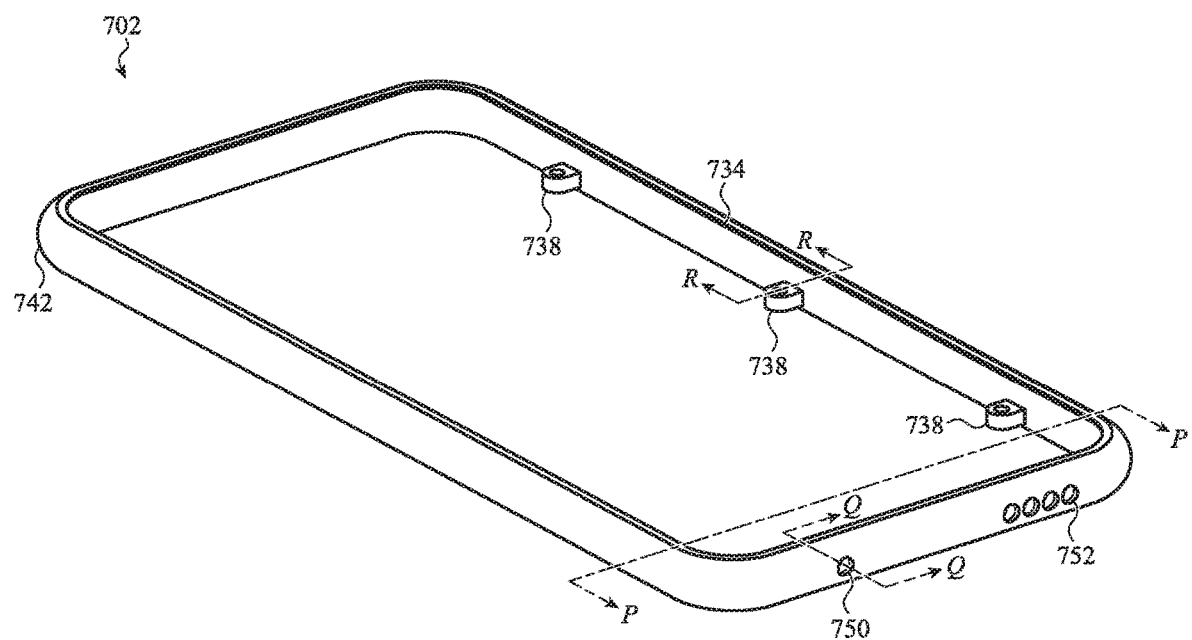
FIG. 7B depicts the electronic device housing after a machinable material has been added and processed.

FIGS. 7A-7E depict an example of a housing of an electronic device, including a shell formed from a brittle material. FIG. 7A depicts a perspective view of the shell formed from the brittle material. FIG. 7B depicts the housing after a machinable material has been added to the shell and processed. FIG. 7C depicts a cross-sectional view of the housing depicted in FIG. 7B, taken along line P-P. FIG. 7D depicts a cross-sectional view of the housing depicted in FIG. 7B, taken along line Q-Q. FIG. 7E depicts a cross-sectional view of the housing depicted in FIG. 7B, taken along line R-R.

As depicted in FIG. 7A, it may be desirable to form a housing 702 for an electronic device from a brittle or otherwise difficult to machine material. However, given the difficulty of machining a housing entirely from this material, the external surface of the housing 702 may be a shell 742 of brittle material. The shell 742 may be formed from a ceramic material in a manner similar to the shell described above with respect to FIGS. 2A-2F, though the shell 742 can be formed of any difficult to machine material.

FIG. 7A may illustrate, for example, a ceramic shell 742 of a housing 702 after the green body of the shell 742 has been sintered to form a hardened, durable external surface for an electronic device. The shell 742 has been shaped (e.g., molded) with a substantially uniform cross-section to enclose features of the electronic device, having four sides. The sintered ceramic shell 742 may define various features, such as an aperture 750 and a group of apertures 752 along a side of the shell 742.

As depicted in FIGS. 7B-7E, a machinable material is deposited into the shell 742 and processed to produce various final interfaces for the housing 702. In many embodiments, the machinable material forms a machined chassis 734. The machined chassis 734 may include various features, such as one or more mounting points 738 (e.g., mounting points for coupling to an internal support frame or other internal components), a microphone mounting region 758 around the aperture 750, and a speaker mounting region 756 around the group of apertures 752.

A microphone mounting region 758 may be formed in the machined chassis deposited around the aperture 750. The microphone mounting region 758 may include a planar recess within the machinable material, and may additionally include threaded apertures 760. The microphone mounting region 758 may facilitate attachment of a microphone, circuitry, and similar components within the electronic device, which may be coupled to the housing 702 via the threaded apertures 760.

A speaker mounting region 756 may similarly be formed in the machined chassis deposited around a group of apertures 752. The speaker mounting region 756 includes an ovular recess to facilitate attachment of a speaker, circuitry, and similar components within the electronic device. In some embodiments, the microphone mounting region 758 and/or the speaker mounting region 756 may further facilitate an O-ring, gasket, or similar liquid-sealing mechanism.

In some embodiments, the machined chassis 734 may also include a machined shelf 716 around a perimeter of the shell 742. The machined shelf 716 may be an attachment point for coupling a transparent cover, such as described below with respect to FIGS. 7F and 7G. The machined chassis 734 may further include a machined back shelf 740 around a perimeter of the shell 742 opposite the machined shelf 716. The machined back shelf 740 may be an attachment point for a back cover, such as described below with respect to FIGS. 7F and 7G.

Figure 7F:
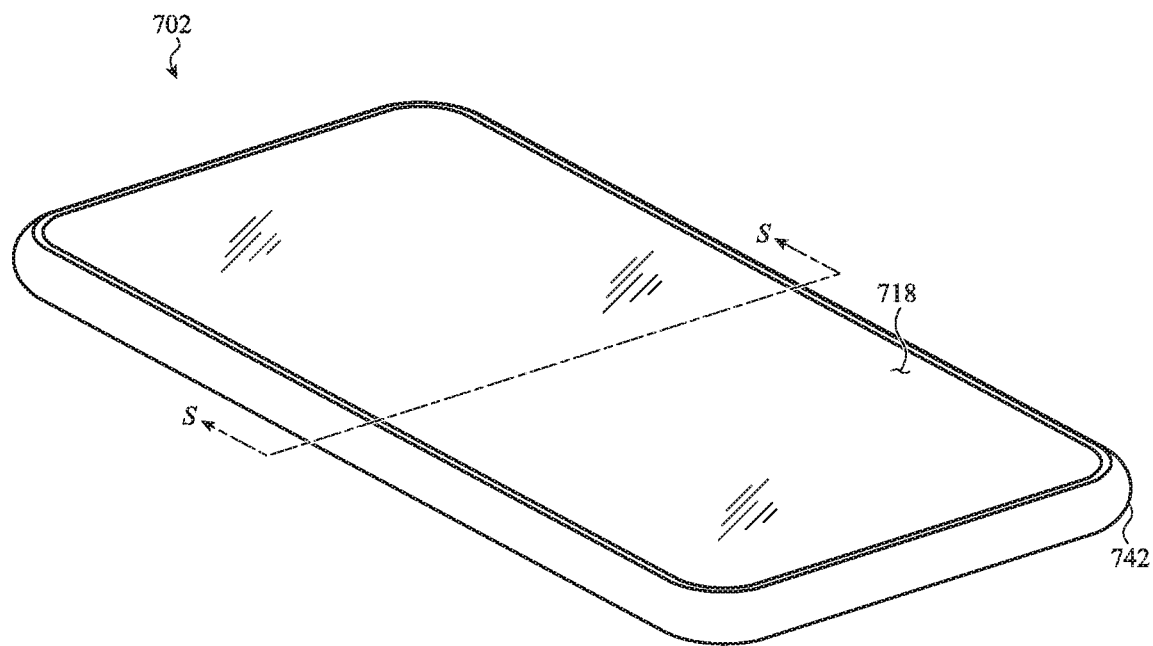
FIG. 7F depicts a perspective view of the housing of an electronic device including a transparent cover and a back cover.
Figure 7G:
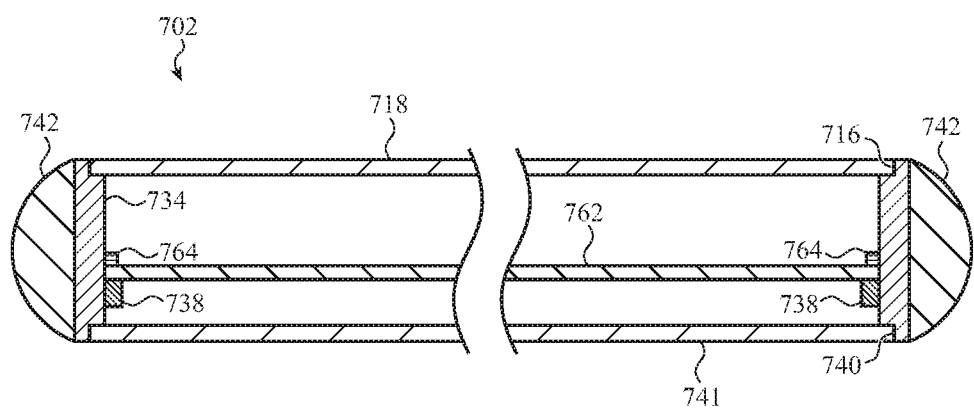
FIG. 7G depicts a cross-sectional view of the housing depicted in FIG. 7F, taken along line S-S.

FIG. 7F depicts a perspective view of the housing of an electronic device after fitting a transparent cover and a back cover to attachment points, such as machined shelves. FIG. 7G depicts a cross-sectional view of the housing depicted in FIG. 7F, taken along line S-S.

The machined shelf 716 may couple the shell 742 of the housing 702 to another component of the electronic device, such as the transparent cover 718 (e.g., a transparent cover 118 over a display 104, such as depicted in FIG. 1). Similarly, the machined back shelf 740 may couple the shell 742 to a back cover 741. The back cover may function as an external surface of the electronic device, and may be transparent or opaque. The back cover can be formed with any suitable material, such as metal, glass, plastic, sapphire, or combinations thereof.

The machined shelf 716 and machined back shelf 740 may each function as a bezel or other retaining mechanism for the covers 718, 741. A seal may be formed between the transparent cover 718 and the machined shelf 716, and another seal may be formed between the back cover 741 and the machined back shelf 740. In some embodiments, the machinable material of the machined shelf 716 and machined back shelf 740 may be a sufficiently compliant material to facilitate a seal. In some embodiments, one or both of the transparent cover 718 and the back cover 741 may be press fit into a respective shelf 716, 740.

In some embodiments, one or both of the machined shelf 716 and the machined back shelf 740 may additionally or alternatively include a groove, beveled edge, or other attachment feature to facilitate retention of the transparent cover 718 and/or the back cover 741. In some embodiments, the transparent cover 718 and/or the back cover 741 may be coupled to the housing 702 by another appropriate means, such as application of an adhesive, a retention clip, and so on.

In some embodiments, the machinable material of the machined chassis 734 may be selected for other performance characteristics, such as conductivity. Accordingly, one or both of the machined shelf 716 and the machined back shelf 740 may function as an antenna or other conductor.

In some embodiments, one or more mounting points 738 (e.g., a screw boss, bracket, or the like) may be formed on or coupled to the machined chassis 734 (see, e.g., FIGS. 5F-5K). An internal component 762 of the electronic device (e.g., a circuit board, internal support frame, and so on) may be coupled to each mounting point 738 through a fastener 764 (e.g., a screw, rivet, clip, pin, and so on) secured to the mounting point (e.g., secured to a threaded aperture such as a screw boss).

Figure 7H:
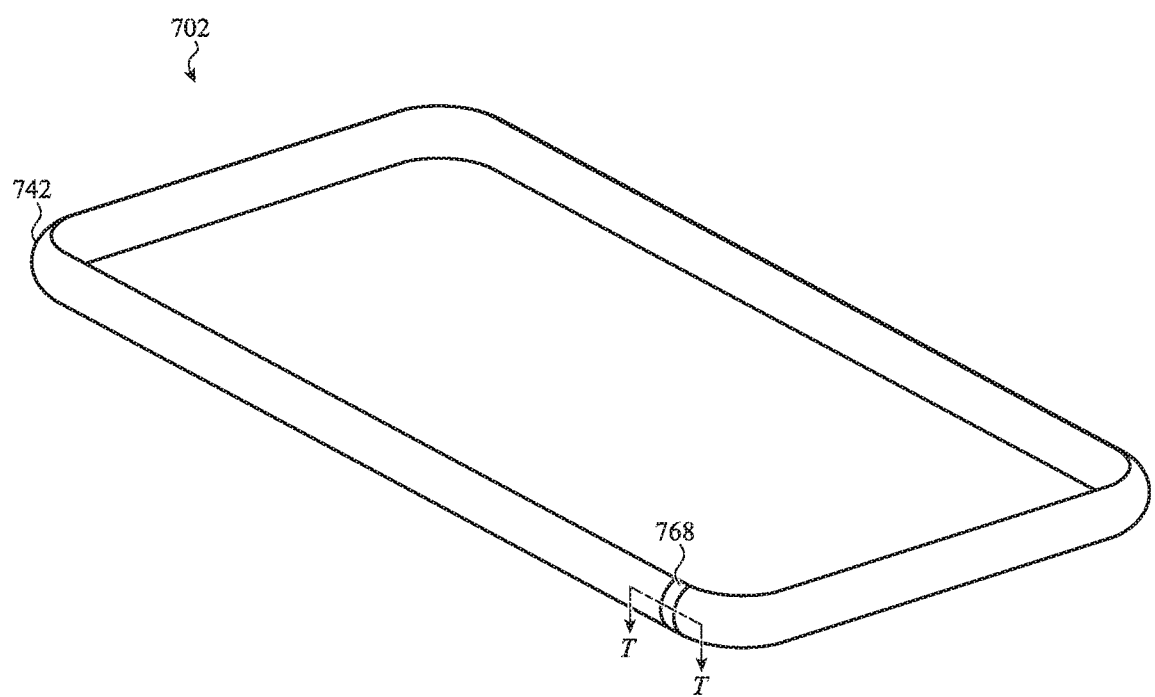
FIG. 7H depicts a housing for an electronic device including an insulating material coupled to the housing by a machinable material.

FIG. 7H depicts a housing for an electronic device including an insulating material coupled to the shell of the housing by a machinable material. In some embodiments, it may be desirable to isolate portions of the shell 742, such as for electrical insulation. For example, the shell 742 may be formed from a metal which is difficult to machine. An insulating insert 768 may be coupled between segments of the shell 742 in order to form an antenna using the conductive material of the shell 742. In some embodiments, the insulating insert 768 may facilitate transmission and/or reception of electromagnetic signals from internal components of the electronic device through the insulating insert 768.

The insulating insert 768 may be formed from an appropriate material, such as plastic, acrylic, nylon, polycarbonate, polyurethane, and so on. A machinable material may be formed on an interior surface of the housing 742, which may provide attachment features to retain the insulating insert 768 to the housing 742.

Figure 7I:
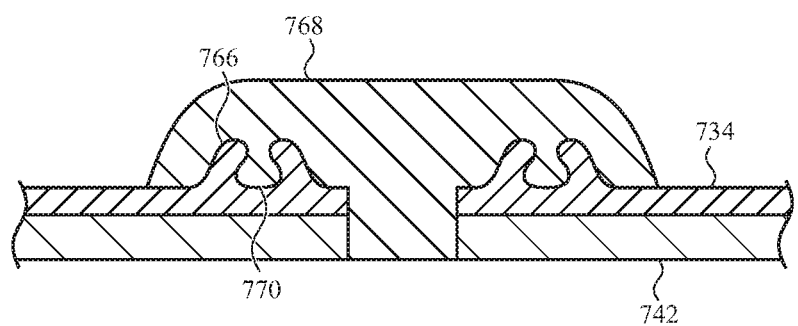
FIG. 7I depicts a cross-sectional view of the housing depicted in FIG. 7H, taken along line T-T.

FIG. 7I depicts a cross-sectional view of the housing depicted in FIG. 7H, taken along line T-T. As depicted in FIG. 7I, the housing includes a shell 742 formed from a difficult to machine material (e.g., a high hardness metal, stainless steel, or ceramic). The shell 742 may define one or more splits 770, which may divide the shell 742 into one or more segments. An insulating insert 768 may be coupled between the segments of the shell 742, electrically isolating the segments.

In certain embodiments, an insulating insert 768 may be insert molded, injection molded, or otherwise formed within a split 770 in the shell 742. In order to facilitate attachment of the insulating insert 768, a machinable chassis 734 may be formed on an interior surface of the shell 742. The machinable chassis 734 may be machined or otherwise shaped to include one or more attachment features 766.

An attachment feature 766 may include multiple protrusions with a keyhole 770 or similar undercut between, in order to facilitate a mechanical interlock between the insulating insert 768 and the attachment feature 766. In some embodiments, an attachment feature 766 may be formed in the machined chasses 734 adjacent each side of a split 770 to further interlock each segment of the shell 742 together through the insulating insert 768.

The above description referenced brittle materials, and in particular sintered ceramic materials and other materials that may be difficult to machine (e.g., stainless steel, hardened steel, high-carbon steel, titanium). It should be understood that the present embodiment is not limited to such materials. Embodiments encompassed within the present disclosure include components for electronic devices formed from any material, in particular any material which has low machinability or for other reasons is costly to machine to produce finished surfaces and attachment features.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising:
a shell forming an exterior surface of the electronic device, the shell comprising a first material;
a chassis formed along an interior of the shell and defining a machined shelf, the chassis comprising a second material;
a display positioned at least partially within the shell; and
a transparent cover positioned over the display and compliantly coupled to the machined shelf to form a seal between the transparent cover and the machined shelf.

2. The electronic device of claim 1, wherein the chassis is formed from a chassis material having a machinability that is greater than a machinability of the shell.

3. The electronic device of claim 1, wherein:
the shell includes a back surface opposite the transparent cover;
the back surface defines an opening;
the chassis defines an attachment feature within the opening;
a back cover is coupled to the attachment feature of the chassis; and
an additional seal is formed between the attachment feature and the back cover by a compliant engagement of the attachment feature with the back cover.

4. The electronic device of claim 1, wherein the transparent cover is press fit within the machined shelf.

5. The electronic device of claim 1, wherein:
the chassis further comprises a set of threaded mounts; and
the electronic device further comprises a circuit board attached to the set of threaded mounts.

6. The electronic device of claim 1, wherein:
the shell defines a first portion of an opening configured to receive a component; and
the chassis defines a second portion of the opening configured to receive the component.

7. The electronic device of claim 6, wherein:
the component is a compressible button; and
the second portion of the opening defines a surface configured to receive the compressible button.

8. The electronic device of claim 7, further comprising:
an O-ring positioned between the second portion of the opening and the compressible button and configured to form a button seal between the chassis and the compressible button.

9. The electronic device of claim 1, wherein:
the shell comprises a ceramic material; and
the chassis comprises at least one of: aluminum, machine steel, or plastic.

10. An electronic device, comprising:
a ceramic shell forming an external surface of the electronic device and defining a display opening and a first portion of a component opening formed along the external surface;
a display positioned within the display opening;
a machined chassis formed from a material different than the ceramic shell and coupled to an interior surface of the shell, the machined chassis defining a second portion of the component opening; and
a component positioned within the component opening.

11. The electronic device of claim 10, wherein the second portion of the component opening defines a contoured surface.

12. The electronic device of claim 11, wherein:
the component opening extends along a length of the shell; and
the second portion of the component opening has a maximum width that is greater than an opening width of the first portion along the external surface.

13. The electronic device of claim 11, wherein:
the machined chassis defines a shelf along a perimeter of the display opening;
the electronic device further comprises a transparent cover positioned over the display; and
the shelf and the transparent cover cooperate to form a seal configured to prevent ingress of contaminants into the electronic device by a compliant engagement of a surface of the shelf with the transparent cover.

\* \* \* \* \*